United States Patent
Geisler et al.

(10) Patent No.: US 10,114,044 B2
(45) Date of Patent: Oct. 30, 2018

(54) CURRENT SENSOR

(71) Applicant: Allegro MicroSystems, LLC, Manchester, NH (US)

(72) Inventors: Dominik Geisler, Heidelberg (DE); Shaun D. Milano, Dunbarton, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/805,616

(22) Filed: Nov. 7, 2017

(65) Prior Publication Data

US 2018/0059148 A1    Mar. 1, 2018

Related U.S. Application Data

(63) Continuation-in-part of application No. 15/231,133, filed on Aug. 8, 2016.

(51) Int. Cl.
| | | |
|---|---|---|
| *G01R 33/36* | (2006.01) | |
| *G01R 15/20* | (2006.01) | |
| *G01R 31/36* | (2006.01) | |
| *G01R 33/07* | (2006.01) | |
| G01R 15/18 | (2006.01) | |

(52) U.S. Cl.
CPC ......... *G01R 15/202* (2013.01); *G01R 15/183* (2013.01); *G01R 15/185* (2013.01); *G01R 15/20* (2013.01); *G01R 15/205* (2013.01); *G01R 15/207* (2013.01); *G01R 31/3606* (2013.01); *G01R 33/07* (2013.01); *G01R 15/186* (2013.01)

(58) Field of Classification Search
CPC ............................. G01R 15/202; G01R 15/183
USPC ............................................................ 324/127
See application file for complete search history.

(56) References Cited

U.S. PATENT DOCUMENTS

| | | | |
|---|---|---|---|
| 3,012,196 A | 12/1961 | Greibach | |
| 4,675,255 A | 6/1987 | Pfeifer et al. | |
| | (Continued) | | |

FOREIGN PATENT DOCUMENTS

| | | |
|---|---|---|
| DE | 102012104348 | 11/2013 |
| EP | 2 682 762 | 1/2014 |

OTHER PUBLICATIONS

U.S. Appl. No. 15/231,133, filed Aug. 8, 2016, Milano et al.
(Continued)

*Primary Examiner* — Reena Aurora
(74) *Attorney, Agent, or Firm* — Daly, Crowley, Mofford & Durkee, LLP

(57) ABSTRACT

A current sensor includes a ferromagnetic core having a substantially central opening for receiving a current conductor and a gap. A detector of the current sensor includes at least one first magnetic field sensing element disposed in a first gap portion and configured to generate a respective first magnetic field signal in response to a first magnetic field having a first angle with respect to the at least one first magnetic field sensing element. The detector also includes at least one second magnetic field sensing element disposed in a second gap portion and configured to generate a respective second magnetic field signal in response to a second magnetic field having a second angle with respect to the at least one second magnetic field sensing element. The first and second magnetic fields are substantially equal in magnitude and the first and second angles are substantially opposite in polarity.

27 Claims, 19 Drawing Sheets

(56) References Cited

U.S. PATENT DOCUMENTS

| | | | |
|---|---|---|---|
| 5,343,184 A | 8/1994 | Matsui et al. | |
| 5,418,514 A | 5/1995 | Smith et al. | |
| 5,825,175 A | 10/1998 | Selcuk | |
| 6,005,383 A | 12/1999 | Savary et al. | |
| 6,040,688 A | 3/2000 | Strubin | |
| 6,177,884 B1 | 1/2001 | Hunt et al. | |
| 6,323,636 B1 | 11/2001 | Cattaneo et al. | |
| 6,388,549 B1 | 5/2002 | Lenhard | |
| 6,411,078 B1* | 6/2002 | Nakagawa | G01R 15/183 324/117 H |
| 6,544,078 B2 | 4/2003 | Palmisano et al. | |
| 6,667,685 B2 | 12/2003 | Wasaki et al. | |
| 6,686,730 B2* | 2/2004 | Marasch | G01R 15/202 324/117 H |
| 6,717,396 B2 | 4/2004 | Viola | |
| 6,756,776 B2 | 6/2004 | Perkinson et al. | |
| 6,781,359 B2 | 8/2004 | Stauth et al. | |
| 7,265,531 B2 | 9/2007 | Stauth et al. | |
| 7,501,808 B2 | 3/2009 | Ishihara et al. | |
| 7,768,083 B2 | 8/2010 | Doogue et al. | |
| 7,936,164 B2 | 5/2011 | Doogue et al. | |
| 9,285,437 B2* | 3/2016 | Rushmer | G01R 33/072 |
| 2003/0227285 A1 | 12/2003 | Marasch et al. | |
| 2004/0263151 A1 | 12/2004 | Zein et al. | |
| 2005/0045359 A1 | 3/2005 | Doogue et al. | |
| 2006/0043960 A1 | 3/2006 | Itoh et al. | |
| 2006/0152210 A1 | 7/2006 | Mangtani et al. | |
| 2006/0175674 A1 | 8/2006 | Taylor et al. | |
| 2006/0181263 A1 | 8/2006 | Doogue et al. | |
| 2006/0219436 A1 | 10/2006 | Taylor et al. | |
| 2006/0255797 A1 | 11/2006 | Taylor et al. | |
| 2007/0247146 A1 | 10/2007 | Stauth et al. | |
| 2007/0252577 A1 | 11/2007 | Preusse | |
| 2008/0048643 A1 | 2/2008 | Delevoye et al. | |
| 2008/0094162 A1 | 4/2008 | Schaerrer et al. | |
| 2013/0169267 A1* | 7/2013 | Miyakoshi | G01R 15/14 324/117 R |
| 2015/0022199 A1* | 1/2015 | Mito | G01R 15/207 324/252 |

OTHER PUBLICATIONS http://www.tdk.co.jp/tefe02/e9a15-zcat.pdf, TDK, Clamp Filters for Cable, Sep. 25, 2006, 4 pages.

Chucheng Xiao, Lingyin Zhao, Tadashi Asada, W.G. Odendaal and J.D. Van Wyk, "An Overview of Integratable Current Sensor Technologies", Center for Power Electronics Systems, Virginia Polytechnic Institute and State University, Blacksburg, VA, IEEE, 2003, 8 pages.

Michael Doogue, Richard Dickinson, Andreas P. Friedrich and William P. Taylor, "An Integrated Hall Effect Based Current Sensor", Proc. Sensor 2005 12$^{th}$ International Conference, vol. II, Munich, Germany, May 2005; 6 pages.

Andreas P. Friedrich, "Low Noise, High Bandwidth Linear Hall Effect Sensors for Analog Position and Current Measurements", Proc. Sensor Conference 2007, Nurnberg, Germany, May 2007, 6 pages.

Milano, Application Note "Advanced Hall-Effect Linear Current Sensor IC Enables High BW Sensing in Hybrid Electric Vehicles and other High Current Sensing Applications", Mar. 27, 2015, 4 pages.

Allegro Datasheet A1363 "Low Noise, High Precision, Programmable Linear Hall Effect Sensor IC With Advanced Temperature Compensation and High Bandwidth (120 kHz) Analog Output", Nov. 16, 2012, 30 pages.

Allegro Datasheet A1366 "Low Noise, High Precision, Factory-Programmed Linear Hall Effect Sensor IC With Advanced Temperature Compensation and High Bandwidth (120 kHz) Analog Output", May 1, 2014, 22 pages.

Restriction Requirement dated Jun. 8, 2009 for U.S. Appl. No. 12/167,681; 6 pages.

Response to Restriction Requirement dated Jun. 22, 2009 for U.S. Appl. No. 12/167,681; 1 page.

Office Action dated Aug. 24, 2009 for U.S. Appl. No. 12/167,681; 15 pages.

Response to Office Action dated Oct. 27, 2009 for U.S. Appl. No. 12/167,681; 14 pages.

Final Office Action dated Jan. 11, 2010 for U.S. Appl. No. 12/167,681; 15 pages.

Response to Office Action dated Feb. 1, 2010 for U.S. Appl. No. 12/167,681; 12 pages.

Office Action dated Mar. 10, 2010 for U.S. Appl. No. 12/167,681; 11 pages.

Response to Office Action dated Apr. 26, 2010 for U.S. Appl. No. 12/167,681; 13 pages.

Final Office Action dated Jun. 11, 2010 for U.S. Appl. No. 12/167,681; 12 pages.

Response to Office Action dated Jul. 13, 2010 for U.S. Appl. No. 12/167,681; 14 pages.

Office Action dated Aug. 20, 2010 for U.S. Appl. No. 12/167,681; 14 pages.

Response to Office Action dated Sep. 24, 2010 for U.S. Appl. No. 12/167,681; 15 pages.

Notice of Allowance dated Oct. 18, 2010 for U.S. Appl. No. 12/167,681; 14 pages.

Extended Search Report dated Jan. 5, 2018 for European Application No. 17184228.9; 7 pages.

Response to Written Opinion dated Aug. 14, 2018 for European Application No. 17184228.9, 14 pages.

Office Action dated Aug. 31, 2018 for U.S. Appl. No. 15/231,133; 15 pages.

* cited by examiner

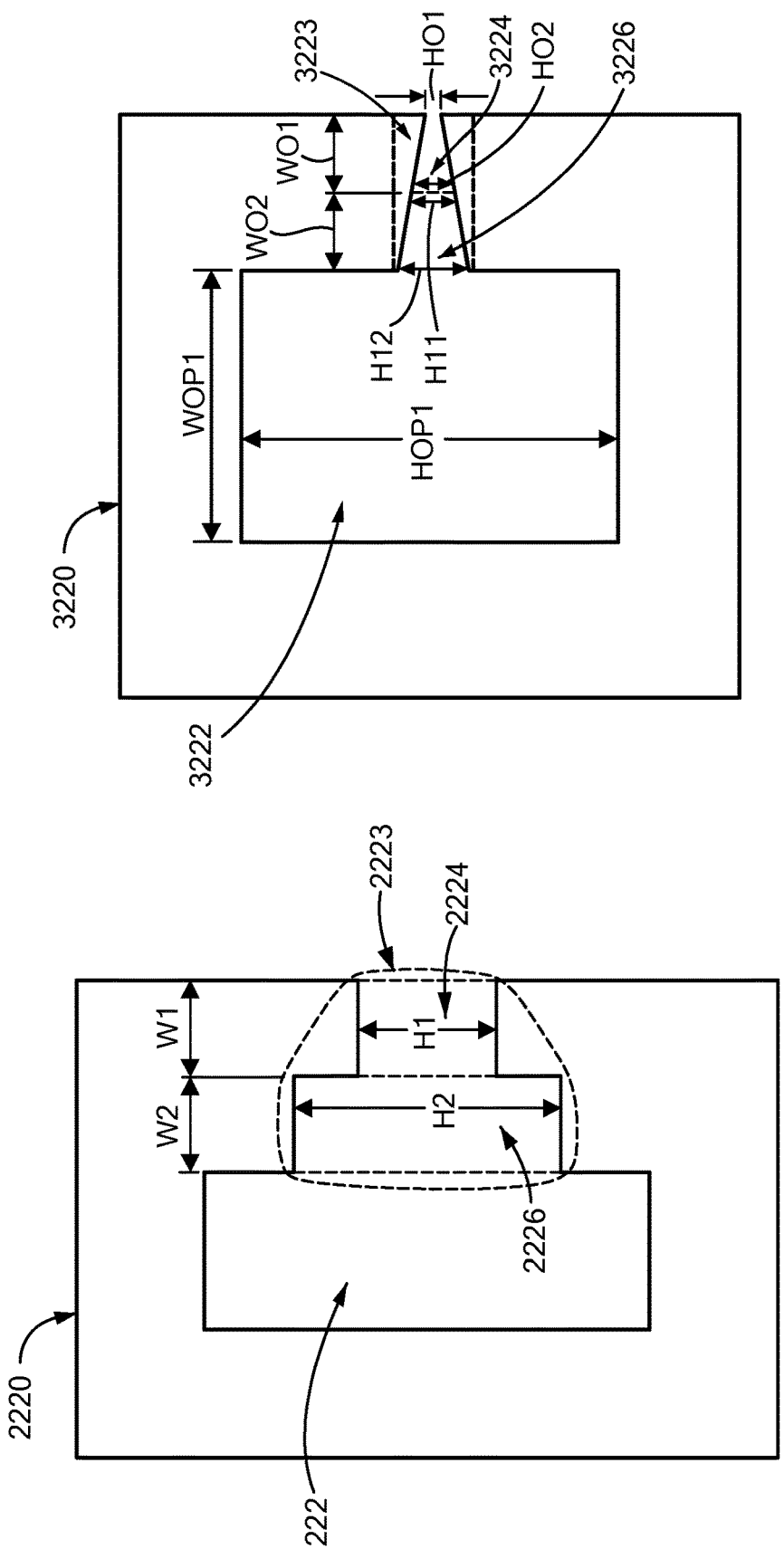

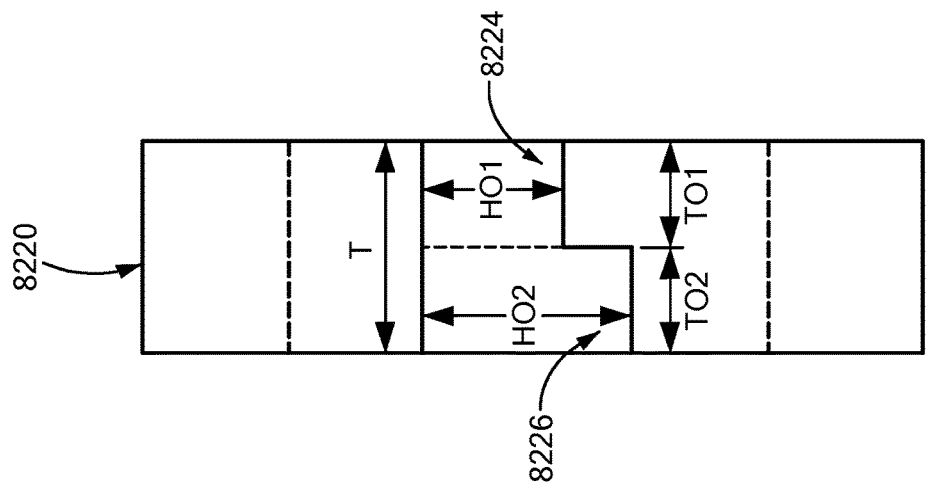
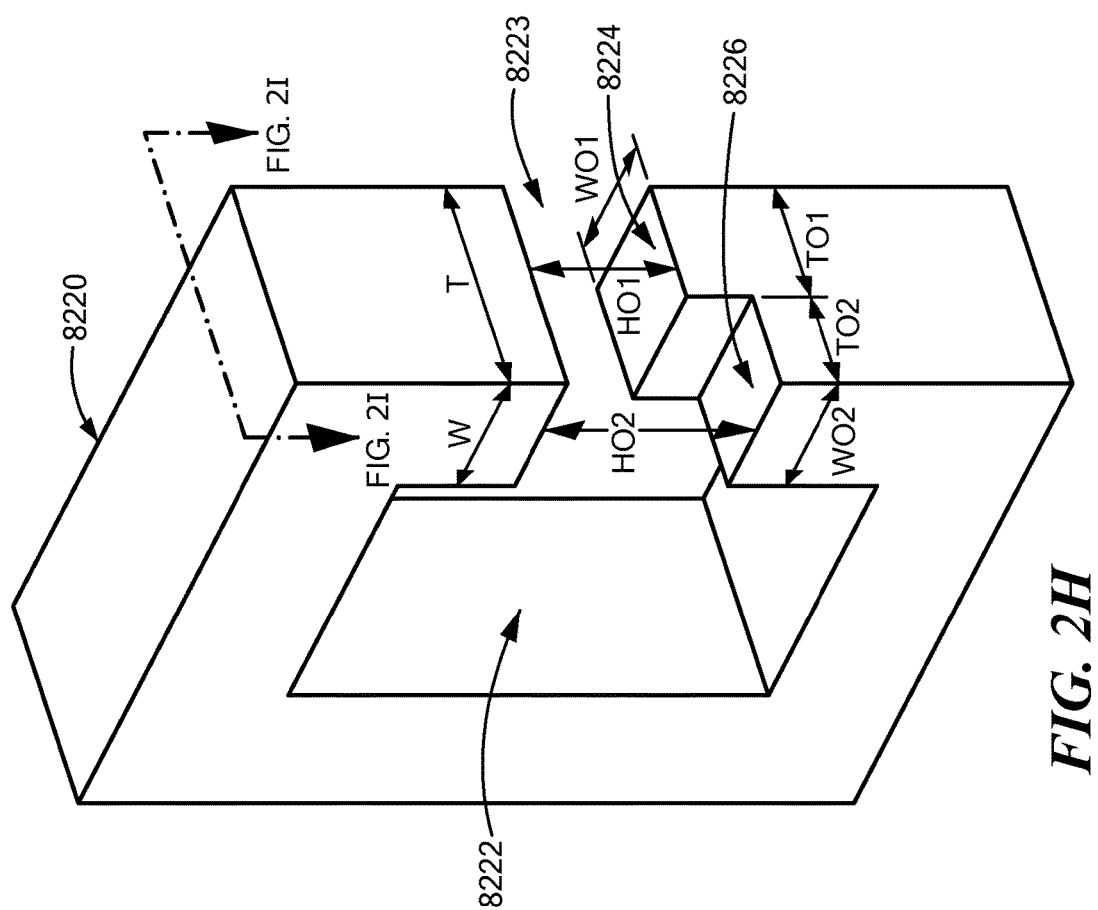

CURRENT SENSOR

CROSS REFERENCE TO RELATED APPLICATIONS

This application is a Continuation-in-Part (CIP) application of and claims the benefit of and priority to U.S. patent application Ser. No. 15/231,133, filed on Aug. 8, 2016, which application is incorporated by reference herein in its entirety.

STATEMENT REGARDING FEDERALLY SPONSORED RESEARCH

Not Applicable.

FIELD

This disclosure relates generally to current sensors, and more particularly, to a current sensor including a ferromagnetic core.

BACKGROUND

As is known, some current sensors include a magnetic field sensor to sense a current through a current conductor. A magnetic field generated in response to the current through the current conductor may be detected by one or more magnetic field sensing elements, such as Hall effect elements and/or magnetoresistance elements, which provide respective signals (i.e., magnetic field signals) proportional to the detected magnetic field. The detected magnetic field may include stray (or disturbing) magnetic fields such as those that may be caused by currents flowing in adjacent conductors.

The accuracy with which the magnetic field-based current sensor senses the current through the current conductor can be affected by its ability to reject stray magnetic fields. A ferromagnetic core can be used to concentrate the magnetic field for detection by the magnetic field sensing elements of the current sensor.

SUMMARY

Described herein are concepts, systems, circuits and techniques related to a current sensor and a method of sensing a current through a current conductor with such a current sensor. In one aspect of the concepts described herein, a current sensor includes a ferromagnetic core having a substantially central opening for receiving a current conductor and a gap comprising at least two gaps portions. A detector of the current sensor includes at least one first magnetic field sensing element disposed in a first one of the gap portions and configured to generate a respective first magnetic field signal in response to a first magnetic field having a first angle with respect to the at least one first magnetic field sensing element. The detector also includes at least one second magnetic field sensing element disposed in a second one of the gap portions and configured to generate a respective second magnetic field signal in response to a second magnetic field having a second angle with respect to the at least one second magnetic field sensing element. The first and second magnetic fields are substantially equal in magnitude and the first and second angles are substantially opposite in polarity.

The current sensor may include one or more of the following features individually or in combination with other features. A first one of the first and second magnetic field signals may increase in response to a stray magnetic field and a second one of the first and second magnetic field signals may decrease in response to the stray magnetic field. Stated differently, the at least one first magnetic field sensing element is responsive to the current-generated magnetic field plus the stray field and the at least one second magnetic field sensing element is responsive to the current generated magnetic field minus the stray field. The current sensor may include a circuit responsive to the first magnetic field signal and to the second magnetic field signal to generate an output signal that is substantially unaffected by the stray magnetic field. The current sensor may include at least one third magnetic field sensing element configured to generate a third magnetic field signal in response to a third magnetic field incident on the at least one third magnetic field sensing element.

The at least one first magnetic field sensing element may be configured to sense the first magnetic field in a plane of the at least one first magnetic field sensing element, the at least one second magnetic field sensing element may be configured to sense the second magnetic field in a plane of the at least one second magnetic field sensing element, and the at least one third magnetic field sensing element may be configured to sense the third magnetic field substantially perpendicular to a plane of the at least one third magnetic field sensing element.

The at least one first magnetic field sensing element and the at least one second magnetic field sensing element may include one or more magnetoresistance elements or one or more flux-gate elements. The magnetoresistance elements may include one or more of a giant magnetoresistance (GMR) element, a magnetic tunnel junction (MTJ) element and a tunneling magnetoresistance (TMR) element. The at least one first magnetic field sensing element and the at least one second magnetic field sensing element may include a plurality of magnetoresistance elements coupled in a bridge configuration. The at least one third magnetic field sensing element may include one or more Hall effect elements.

The at least one first magnetic field sensing element and the at least one second magnetic field sensing element may be configured to sense a first current level range through the current conductor, and the at least one third magnetic field sensing element may be configured to sense a second, different current level range through the current conductor. The second current level range may include currents having a magnitude greater than a magnitude of currents associated with the first current level range.

The detector may include a first circuit responsive to the first magnetic field signal and to the second magnetic field signal to generate a first detector output signal indicative of a measured current in the first current level range, and the detector may include a second circuit responsive to the third magnetic field signal to generate a second detector output signal indicative of the measured current in the second current level range. The detector may include an output circuit responsive to the first detector output signal and the second detector output signal to generate one or more output signals of the current sensor indicative of the current through the current conductor. The first detector output signal and the second detector output signal may be combined to generate the current sensor output signal that covers the low current range using the first and second elements (in a manner that combines the stray field rejection of the first and second elements) and the higher current range using the third element.

The at least one third magnetic field sensing element may be disposed between the at least one first magnetic field sensing element and the at least one second magnetic field sensing element. The gap may have a first gap surface with a first surface area and a second, opposing gap surface with a second, larger surface area than the first surface area. The detector may be attached to the first gap surface. The first gap surface may be a substantially flat surface and the second gap surface may be an angled surface or a curved surface. The second gap surface may have a substantially V shape or a substantially U shape. The at least one third magnetic field sensing element may be positioned at a center point of the first gap surface and the at least one first magnetic field sensing element and the at least one second magnetic field sensing element may be spaced substantially equidistantly from the at least one third magnetic field sensing element. The at least one first magnetic field sensing element, the at least one second magnetic field sensing element and the at least one third magnetic field sensing element may be supported by a single die.

In another aspect of the concepts described herein, a method of sensing a current through a current conductor disposed through an opening of a ferromagnetic core includes placing at least one first magnetic field sensing element in a first portion of a gap of the ferromagnetic core, and placing at least one second magnetic field sensing element in a second portion of the gap. A first magnetic field signal is generated by the at least one first magnetic field sensing element in response to a first magnetic field having a first angle with respect to the at least one first magnetic field sensing element, and a second magnetic field signal is generated by the at least one second magnetic field sensing element in response to a second magnetic field having a second angle with respect to the at least one second magnetic field sensing element. The first and second magnetic fields are substantially equal in magnitude and the first and second angles are substantially opposite in polarity. A first detector output signal indicative of a measured current in the first current level range is generated in response to the first magnetic field signal and the second magnetic field signal when the current through the current conductor is within the first current level range.

The method may include one or more of the following features either individually or in combination with other features. At least one third magnetic field sensing element may be placed between the at least one first magnetic field sensing element and the at least one second magnetic field sensing element, the at least one third magnetic field sensing element generating a third magnetic field signal in response to a third magnetic field incident on the at least one third magnetic field sensing element. A second detector output signal indicative of a measured current in a second, different current level range than the first current level range may be generated in response to the third magnetic field signal when the current through the current conductor is within the second current level range. An output signal of the current sensor indicative of the current through the current conductor may be generated with an output circuit in response to the first detector output signal and the second detector output signal. The first detector output signal and the second detector output signal may be combined to generate the current sensor output signal.

In a further aspect of the concepts described herein, a current sensor includes a ferromagnetic core having a substantially central opening for receiving a current conductor and a gap. The current sensor also includes means positioned in a first portion of the gap for generating a first magnetic field signal in response to a first magnetic field having a first angle with respect to the first magnetic field signal generating means and means positioned in a second portion of the gap for generating a second magnetic field signal in response to a second magnetic field having a second angle with respect to the second magnetic field signal generating means. The first and second magnetic fields are substantially equal in magnitude and the first angle and the second angle are substantially opposite in polarity. The current sensor may further include a means for generating an output signal of the current sensor indicative of the current through the current conductor in response to the first magnetic field signal and the second magnetic field signal. The gap may have a first gap surface with a first surface area and a second, opposing gap surface with a second, larger surface area than the first surface area. The first magnetic field signal generating means and the second magnetic field signal generating means may be attached to the first gap surface.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 2B is a side view of a third example configuration of a ferromagnetic core according to the first embodiment of the disclosure;

FIG. 2C is a side view of a fourth example configuration of a ferromagnetic core according to the first embodiment of the disclosure;

FIG. 2H is a perspective view of a ninth example configuration of a ferromagnetic core according to the first embodiment of the disclosure;

FIG. 2I is a cross-sectional view of the ferromagnetic core of FIG. 2H;

DETAILED DESCRIPTION

Figure 1:
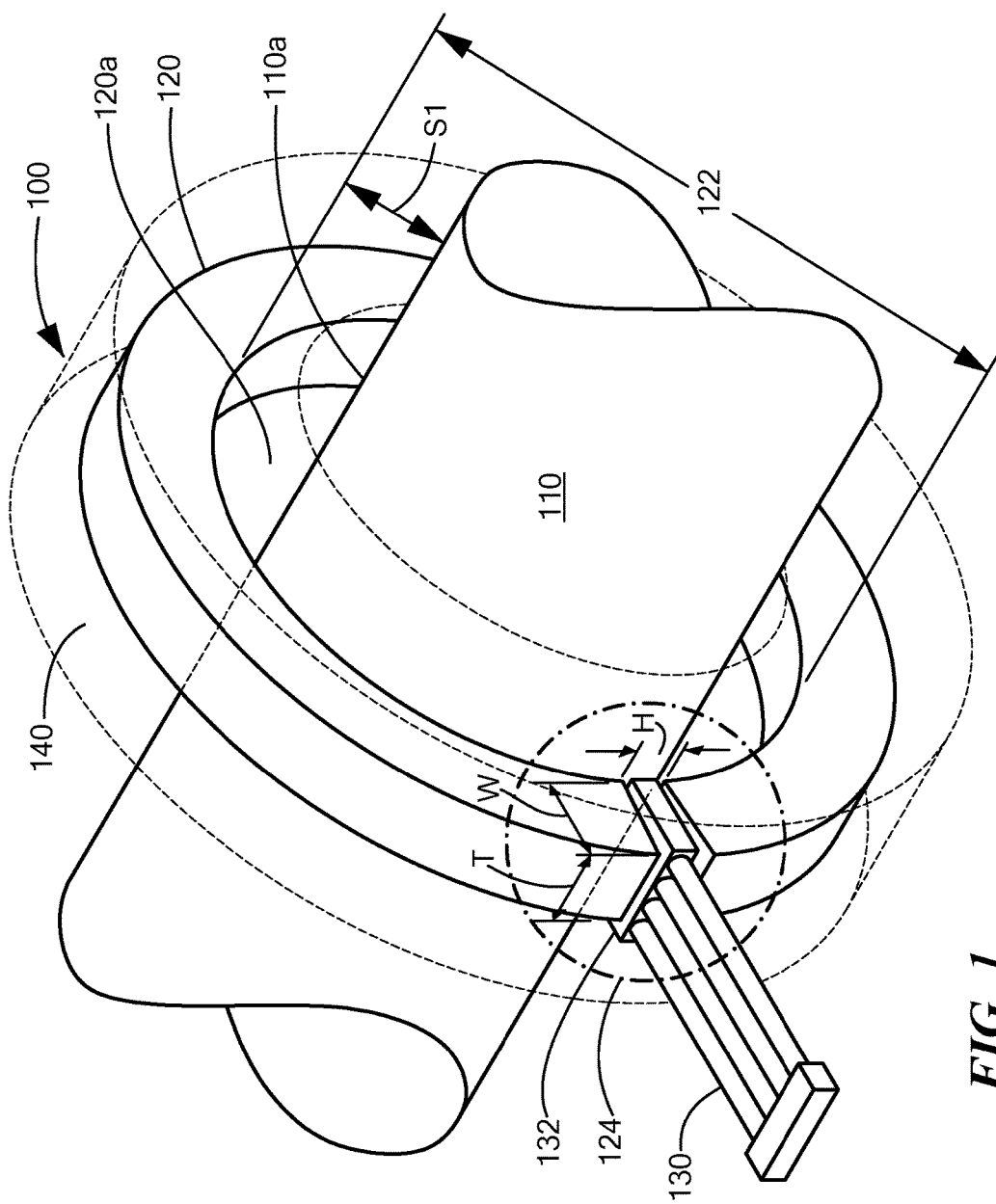
FIG. 1 shows an example prior art current sensor for sensing current through a current conductor.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

For convenience, certain introductory concepts and terms used in the specification are collected here.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

The term "magnetic field sensing element" can be used to describe more than one physical semiconductor structure (for example, more than one magnetoresistance element yoke) coupled together in such a way as to generate one or more magnetic field signals in response to a magnetic field. Thus, individual magnetic field sensing elements shown in figures below can instead each be comprised of more than one magnetic field sensing element.

As used herein, the term "magnetic field sensor" is used to describe a circuit that uses one or more magnetic field sensing elements, generally in combination with other components and/or circuits. Magnetic field sensors are used in a variety of s, including, but not limited to, a current sensor that senses a magnetic field generated by a current carried by a current-carrying conductor.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit.

While examples below describe current sensors for sensing a current through specific current conductors (e.g., current-conducting wires or busbars), it should be appreciated that the current sensors disclosed herein may be found suitable for sensing a current through a variety of current conductor types.

Additionally, while currents sensors including ferromagnetic cores having a specific number of gap portions (e.g., two gap portions) are described in several examples below, such is discussed to promote simplicity, clarity and understanding in the description of the concepts, systems, circuits and techniques sought to be protected herein and is not intended to be, and should not be construed as, limiting. The current sensors disclosed herein may, for example, be implemented using ferromagnetic cores having more than the specific number of gap portions.

Further, it should be appreciated that, as used herein, relational terms, such as "first," "second," "top," "bottom," "left," "right," and the like, may be used to distinguish one element or portion(s) of an element (e.g., a first gap portion of a ferromagnetic core) from another element or portion(s) of the element (e.g., a second gap portion of a ferromagnetic core) without necessarily requiring or implying any physical or logical relationship or order between such elements.

Referring to FIG. 1, an example prior art current sensor 100 for sensing a current through a current conductor 110 includes a ferromagnetic core 120 and a detector 130. The ferromagnetic core 120 (i.e., a magnetic concentrator) has an opening 122 for receiving the current conductor 110 (e.g., a current-conducting wire) and a single gap portion, or air gap, or simply gap 124, in which at least a portion of the detector 130 (e.g., at least one magnetic field sensing element 132 of the detector 130, as will be discussed) is disposed. Additionally, one or more of the current conductor 110, the ferromagnetic core 120 and the detector 130 may be surrounded by and/or coupled to an enclosure 140 (e.g., application specific housing).

The ferromagnetic core 120, which is shown as taking the form of a substantially circular, ring-Shaped core, may comprise a variety of magnetic field concentrating materials including, for example, a ferrite material, laminated steel, and an iron alloy. These materials are typically selected based on a variety of factors, including permeability, resistivity, and/or cost of the material. For example, iron alloys such as ferrosilicon (FeSi) or ferronickel (FeNi) are commonly used materials for ferromagnetic cores in power applications because they exhibit a substantially high permeability.

Additionally, the ferromagnetic core 120 typically has dimensions selected based on dimensions associated with the application, dimensions of the current conductor 110 received in the opening 122, and a single range of current levels through the conductor 110 to be sensed by the current sensor 100. For example, the ferromagnetic core 120 may have dimensions selected such that a predetermined distance S1 exists between a surface 110a (i.e., an outer surface) of the current conductor 110 and a surface 120a (i.e., an inner surface) of the ferromagnetic core 120 in the opening 122. Distance S1 may be selected to achieve a certain minimum distance between surface 110a of current conductor 110 and surface 120a of core 120 in order to prevent the core 120 from saturating at high currents. For example, distance S1 may be between about three millimeters and about four millimeters. Magnetic fields generated in the core 120 are typically concentrated in the gap 124.

The gap 124 is formed in a select portion of the ferromagnetic core 120 and has dimensions that, along with the core material, establish a particular magnetic coupling in the gap 124. In the illustrated embodiment, the gap 124 takes the form of a rectangular prism having an associated width W (defined by the difference between an inner diameter of the core 120 and an outer diameter of the core 120), thickness T, and air gap length, or height H. The core diameter and cross section (T*W) are generally selected to be as large as an application allows as the larger the diameter and the larger the cross section, the higher the core saturation point. The air gap height H is a significant dimension as it directly affects the gain of the magnetic concentration (i.e., impact on the resulting magnetic flux density in the gap 124). In particular, for a constant cross-sectional area, the smaller the air gap height H, the higher the concentration gain associated with the gap.

The detector 130, which may be provided as a magnetic field sensor, for example, includes at least one magnetic field sensing element 132 disposed in the gap 124. The at least one magnetic field sensing element 132 may take the form of a Hall effect element, for example, and may be configured to generate a magnetic field signal at an output in response to an applied magnetic field (e.g., a magnetic field as may be generated in the gap 124 in response to current through the current conductor 110, as will be discussed). The detector 130 may also include circuitry (i.e., processing circuitry) coupled to the at least one magnetic field sensing element 132 and configured to provide an output signal of the current sensor 100 indicative of the current through the current conductor 110. Dimensions of the gap 124 may be adjusted based on package thickness of the detector 130.

The above-described prior art current sensor 100 is configured to sense a current through the current conductor 110. In particular, a magnetic field can be generated in the ferromagnetic core 120 in response to a current through the current conductor 110 and the ferromagnetic core 120 may concentrate the generated magnetic field in the gap 124 (i.e., proximate to the detector 130). Additionally, the at least one magnetic field sensing element 132 can generate a magnetic field signal in response to the magnetic field in the gap 124 and circuitry responsive to the magnetic field signal can provide an output signal of the current sensor 100 indicative of the current through the current conductor 110. For example, a magnitude of the output signal may be substantially proportional to a magnitude of the current through the current conductor 110.

The prior art current sensor 100 provides an output signal (i.e., a current sensor output signal) indicative of the current through the current conductor for a single current level range. Thus, in electronic circuits that require sensing of a plurality of different current level ranges (e.g., a first current level range and a second current level range greater than the first current level range), the current sensor 100 alone may be insufficient. Such electronic circuits typically require a plurality of current sensors for sensing a respective plurality of current level ranges. The use of multiple current sensors can be costly, both in terms of material costs and space.

Figure 2A:
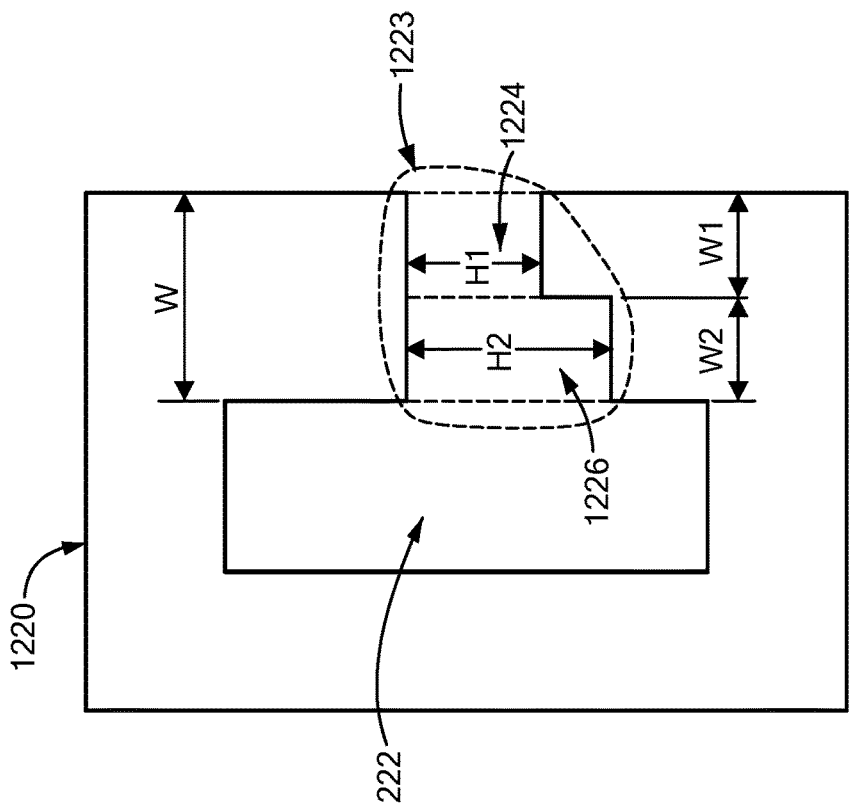
FIG. 2A is a side view of a second example configuration of a ferromagnetic core according to the first embodiment of the disclosure.
Figure 2:
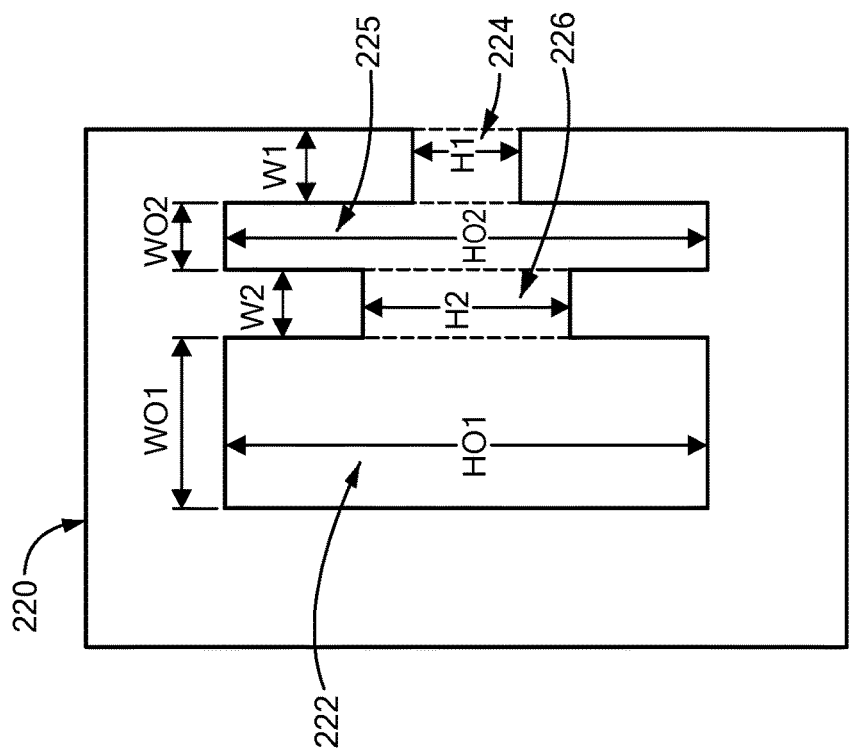
FIG. 2 is a side view of a first example configuration of a ferromagnetic core as may be provided in a current sensor according to a first embodiment of the disclosure.
Figure 2E:
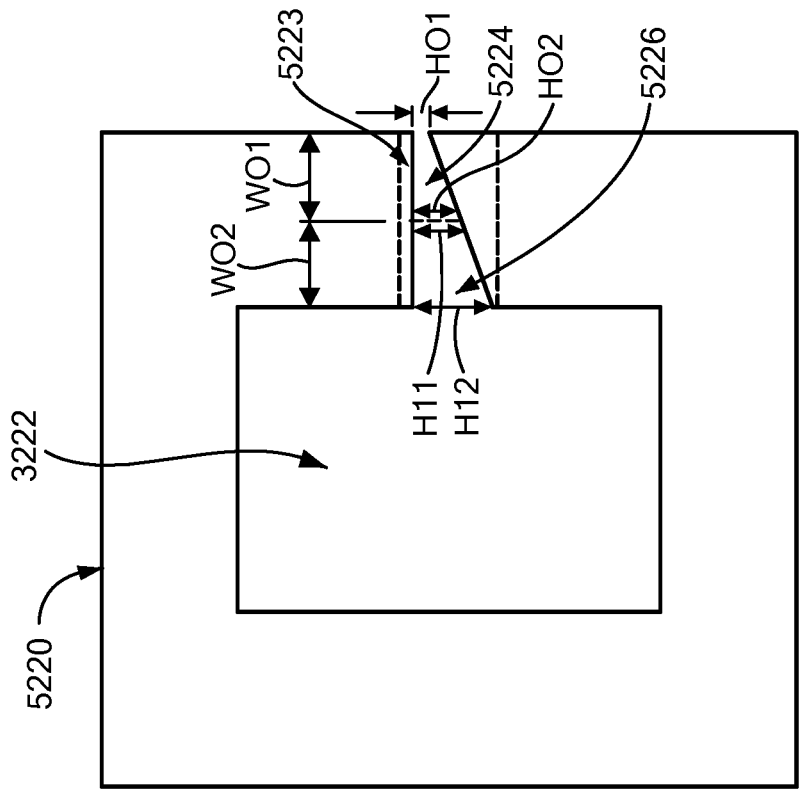
FIG. 2E is a side view of a sixth example configuration of a ferromagnetic core according to the first embodiment of the disclosure.
Figure 2D:
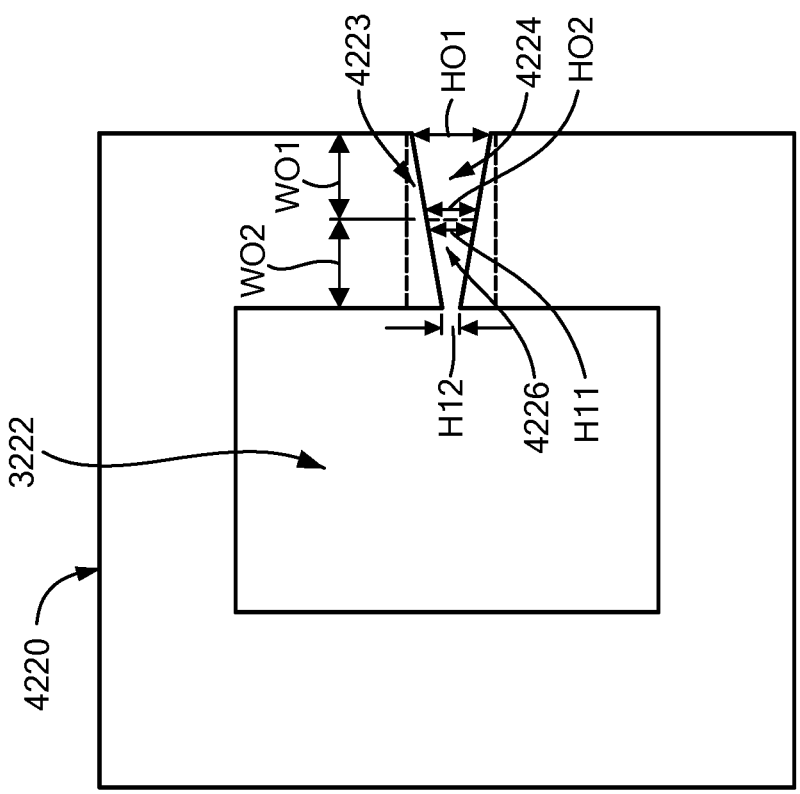
FIG. 2D is a side view of a fifth example configuration of a ferromagnetic core according to the first embodiment of the disclosure.
Figure 2G:
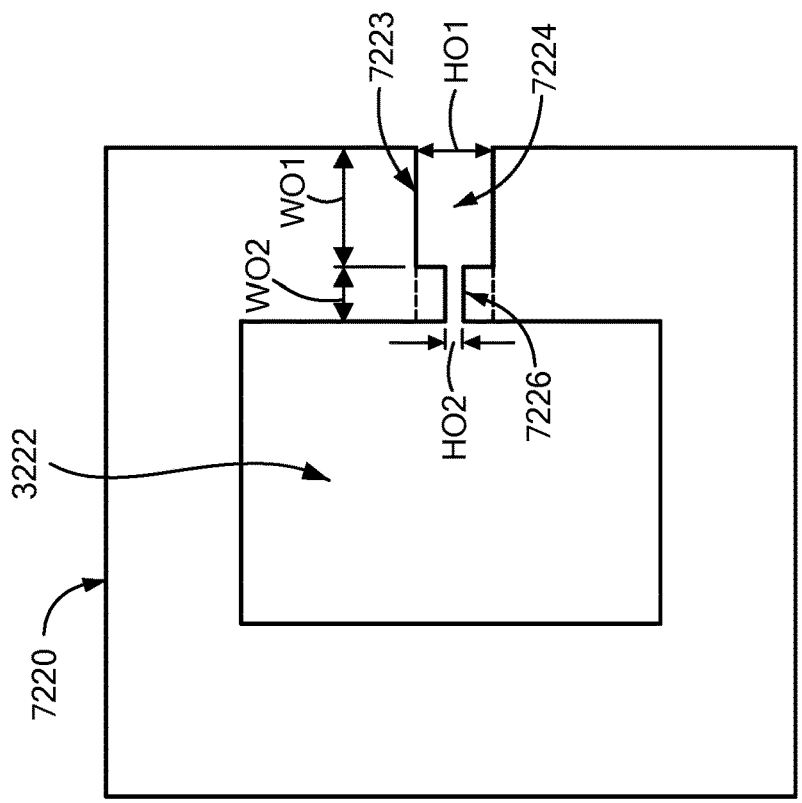
FIG. 2G is a side view of an eighth example configuration of a ferromagnetic core according to the first embodiment of the disclosure.

Referring to FIGS. 2-2G, example ferromagnetic cores (e.g., 220, shown in FIG. 2) as may be provided in a current sensor according to a first embodiment of the disclosure are shown. In contrast to ferromagnetic core 120 shown in FIG. 1, each of the ferromagnetic cores of FIGS. 2-2G has at least two gaps or gap portions (e.g., 224 and 226, shown in FIG. 2) for sensing a corresponding plurality of current level ranges. In order to sense a current through a current conductor (e.g., 110, shown in FIG. 1) received in an opening (e.g., 222) of the ferromagnetic cores of FIGS. 2-2G, for example, at least one first magnetic field sensing element is positioned in a first gap portion (e.g., 224) of the ferromagnetic core having a first gap spacing and at least one second magnetic field sensing element is positioned in a second gap portion (e.g., 226) of the ferromagnetic core having a second gap spacing, different than the first gap spacing.

Depending on the current level range of the current through the current conductor (e.g., first or second current level ranges), an output signal of the current sensor may be indicative of either a first magnetic field signal generated by the at least one first magnetic field sensing element in response to a first magnetic field generated in the first gap portion or a second magnetic field signal generated by the at least one second magnetic field sensing element in response to a second magnetic field generated in the second gap portion. For example, the current sensor output signal may be generated in response to the first magnetic field signal when the current through the current conductor is within a first current level range (e.g., about 0 mA to about 100 mA) and in response to the second magnetic field signal when the current through the current conductor is within a second, higher current level range (e.g., about 1 A to about 1000 A). Additional aspects of current sensing by current sensors including the ferromagnetic cores of FIGS. 2-2G, for example, will be described further in conjunction with FIGS. 3-3B.

It should be appreciated that the example ferromagnetic cores of FIGS. 2-2G described below are but several of many potential configurations of ferromagnetic cores in accordance with the disclosure. For example, while ferromagnetic cores having a substantially "C" shape are shown in FIGS. 2-2G, it should be appreciated that the ferromagnetic cores may take the form of a variety of different shapes (e.g., depending on the application). Additionally, it should be appreciated that the example at least two gap portions of the ferromagnetic cores described in figures below can be provided in the form of a single gap (e.g., gap 1223, shown in FIG. 2A or gap 3223, shown in FIG. 2C) or as a plurality of distinct gaps (e.g., gap 224, 226, shown in FIG. 2). Further, while the at least two gap portions are shown taking the form of particular shapes (e.g., rectangular prisms) in the figures below, it should be appreciated that the at least two gap portions can take the form of a variety of shapes such as a rectangular prism, a cube, a sphere, an ellipsoid, a cylinder, a cone, a pyramid and the like. Additionally, the gap spacings associated with the respective gap portions, which may affect the magnetic fields in the gap portions, as discussed above, may be based on one or more dimensions (e.g., a width, thickness, and/or height) of the gap portions.

Referring to FIG. 2, a first example ferromagnetic core 220 according to the first embodiment of the disclosure has a substantially central opening 222 for receiving a current conductor (e.g., 110, shown in FIG. 1) and first and second distinct gaps, or gap portions 224, 226. First gap portion 224 has a first gap spacing (here, including a respective height H1) and second gap portion 226 has a second gap spacing (here, including a respective height H2), larger than the first gap spacing. The different gap spacing between the first gap portion 224 and the second gap portion 226 may be established by changing one or more dimensions of one gap portion relative to the other. For example, the first and second gap portions 224, 226 may have the same cross-sectional area (e.g., width W and thickness T) but different gap heights H1, H2, as shown. As one example, height H1 may be between about 1.2 millimeters (mm) and about 1.5 mm, and height H2 may be about 5 mm. As another example, the height H1 and height H2 may be selected to be substantially any height (e.g., between about 2 mm and about 10 mm) suitable for current sensing, but are selected such that the height H2 is larger than the height H1 and such that the heights H2 and H1 are substantially larger than package thickness of a detector (e.g., 130, shown in FIG. 2) provided in the first and second gap portions 224, 226.

The first gap spacing and, thus, one or more dimensions of the first gap spacing (e.g., H1), may be selected based, at least in part, on a first current level range to be sensed by the current sensor including the ferromagnetic core 220 (and a first magnetic field to be generated in the first gap portion 224). Additionally, the second gap spacing and, thus, one or more dimensions of the second gap spacing (e.g., H2), may be selected based, at least in part, on a second current level range to be sensed by the current sensor (and a second magnetic field to be generated in the second gap portion 226). The second current level range may, for example, be higher than the first current level range in some embodiments and the second gap spacing may provide for a lower concentration gain than the first gap spacing used for sensing the first current level range. Stated differently, magnetic field detection in the first gap portion 224 can correspond to sensing lower currents and thus, can be referred to as a high resolution position. Additionally, the magnetic field detection in the second gap portion 226 can correspond to sensing higher currents and thus, can be referenced as a low resolution position.

Ferromagnetic core 220 also includes an opening 225 between the first and second gap portions 224, 226 in the illustrated embodiment. Dimensions of the opening 225 (e.g., a height HO2 and/or a width WO2) may, for example, be selected based, at least in part, on the first current level range and the second current level range to be sensed by the current sensor. Dimensions of the opening 225 may also be selected based upon dimensions of the ferromagnetic core 220 and a spacing as may be needed between the first and second gap portions 224, 226 to provide for sensing of the first and second current level ranges by the sensor including the ferromagnetic core 220. For example, dimensions of the opening 225 may be selected to achieve a desired ratio (e.g., two to one, ten to one, one hundred to one, etc.) between the first and second current level ranges to be sensed. Further, dimensions of the opening 222 (e.g., a height HO1 and/or a width WO1) in ferromagnetic core 220 may be selected based, at least in part, on dimensions of the current conductor to be received by the opening 222.

The ferromagnetic core 220 may comprise materials including, but not limited to, a ferrite material, laminated steel, an iron alloy, a Supermalloy, a nickel alloy, a cobalt alloy, and a Permalloy. Additionally, the ferromagnetic core 200 may take the form of a variety of shapes and sizes. For example, the ferromagnetic core 220 may take the form of a "C" shape and have a substantially circular shape or a substantially square or rectangular shape. In one embodiment, the dimensions of the ferromagnetic core 220 and dimensions of the first and second gap portions 224, 226 in the ferromagnetic core 220 are selected based, at least in part, on a magnitude of the first and second current level ranges to be sensed using the ferromagnetic core 220.

The magnitude of the first and second current level ranges to be sensed may, for example, depend on the current sensing application. For example, in a battery monitoring application in an automobile, the first current level range may correspond to a current level range suitable for measuring substantially "small" currents (e.g., leakage currents) when the automobile is off and the second current level range may correspond to a current level range suitable for measuring substantially "large" currents when the automobile is operating. In some embodiments, the ferromagnetic core 220 may include additional gap portions (e.g., third or fourth gap portions) as may be suitable for sensing additional current level ranges (e.g., third or fourth current level ranges).

Additionally, in some embodiments the ferromagnetic core 220 may be surrounded by an enclosure (not shown) which may comprise a material (e.g., a plastic molded material) as may be suitable for a particular current sensing application. For example, in a high temperature/high mechanical stress environment, such as an automotive environment, the enclosure may include a high temperature molding material. Such may, for example, reduce the environmental impact on sensing accuracy by the current sensor including the ferromagnetic core 220.

Referring to FIG. 2A, in which like elements of FIG. 2 are provided having like reference designations, a second example ferromagnetic core 1220 according to the first embodiment of the disclosure has an opening 222 for receiving a current conductor and first and second gap portions 1224, 1226 provided in the form a single gap 1223. In one embodiment, ferromagnetic core 1220 functions in a similar manner as core 220 of FIG. 2, providing the ability to sense first and second current level ranges. However, by providing the first and second gap portions 1224, 1226 in the form the single gap 1223, rather than in the form of multiple, distinct gaps (e.g., 224, 226, shown in FIG. 2), dimensions of the core 1220 may be smaller than otherwise would be possible if the core 1220 were to have multiple gaps. Further, costs associated with manufacturing the core 1220 may be less due to the smaller form factor of the core 1220.

A lateral cross-section of the gap 1223, taken through a width of core 1220 (e.g., the dimension from the outer diameter of the core 1220 to the inner diameter of the core 1220), corresponds to a step shape in the illustrated embodiment. First gap portion 1224 has a first gap spacing (here, including a respective height H1) and second gap portion 1226 has a second gap spacing (here, including a respective height H2), larger than the first gap spacing. Similar to ferromagnetic core 200 of FIG. 2, the different gap spacing between the first gap portion 1224 and the second gap portion 1226 may be established by changing one or more dimensions of one gap portion relative to the other. For example, the first and second gap portions 1224, 1226 may have the same cross-sectional area (e.g., width W and thickness T) but different gap heights H1, H2, as shown. It follows that the first and second gap portions 1224, 1226 have different gap spacings and, thus, provide for different concentration gains.

The first gap spacing and, thus, one or more dimensions of the first gap spacing (e.g., H1), may be selected based, at least in part, on a first current level range to be sensed by the current sensor including the ferromagnetic core 1220 (and a first magnetic field to be generated in the first gap portion 1224). Additionally, the second gap spacing and, thus, one or more dimensions of the second gap spacing (e.g., H2), may be selected based, at least in part, on a second current level range to be sensed by the current sensor (and a second magnetic field to be generated in the second gap portion 1226). The second current level range may, for example, be higher than the first current level range in some embodiments and require less magnetic field concentration gain in the second gap portion 1226 than the first current level range in the first gap portion 1224.

With the above arrangement, a first magnetic field may be generated in the first gap portion 1224 in response to a current in the first current level range and a second magnetic field (e.g., a less concentrated magnetic field due to the second, larger gap spacing) may be generated in the second gap portion 1226 in response to a current in the second current level range.

Referring to FIG. 2B, a third example ferromagnetic core 2220 has an opening 222 for receiving a current conductor and first and second gap portions 2224, 2226 provided in the form a single gap 2223. A lateral cross-section of the gap 2223, taken through a width of core 2220 (e.g., the dimension from the outer diameter of the core 2220 to the inner diameter of the core 2220), corresponds to a step shape in the illustrated embodiment. First gap portion 2224 has a first gap spacing (here, including a respective height H1) and second gap portion 2226 has a second gap spacing (here, including a respective height H2), larger than the first gap spacing. It follows that the second gap portion 2226 may provide for less magnetic field concentration gain than the first gap portion 2224 and, thus, may be more suitable for sensing larger currents than first gap portion 2224.

Referring to FIG. 2C, a fourth example ferromagnetic core 3220 has an opening 3222 for receiving a current conductor (e.g., 110, shown in FIG. 1) and first and second gap portions 3224, 3226 provided in the form a single gap 3223. A lateral cross-section of the gap 3223, taken through a width of core 3220 (e.g., the dimension from the outer diameter of the core 3220 to the inner diameter of the core 3220), corresponds to a ramp or wedge shape in the illustrated embodiment. First gap portion 3224, which occupies a first portion of the ramp or wedged shaped gap 3223, has a first gap spacing (here, including a respective first height H01 and a respective second height H02). Additionally, second gap portion 3226, which occupies a second portion of the gap 3223, has a second gap spacing (here, including a respective first height H11 and a respective height H12), larger than the first gap spacing. It follows that the second gap portion 3226 may provide for less of a concentration gain than the first gap portion 3224 and, thus, may be more suitable for sensing larger currents than first gap portion 3224. A slope and, thus, one or more dimensions of the gap 3223, may be selected to achieve a desired ratio between first and second current level ranges to be sensed in the first and second gap portions 3224, 3226. The gap slope may also be selected based upon type(s) of sensing elements to be disposed in the first and second gap portions 3224, 3226 and may include consideration of a saturation level associated with the sensing elements. Further, dimensions of the opening 3222 (e.g., a height HOPI and/or a width WOP1) may be selected based, at least in part, on dimensions of the current conductor to be received by the opening 3222.

Referring to FIG. 2D, in which like elements of FIG. 2C are provided having like reference designations, a fifth example ferromagnetic core 4220 has opening 3222 and first and second gap portions 4224, 4226 provided in the form a single gap 4223. A lateral cross-section of the gap 4223, taken through a width of core 4220 (e.g., the dimension from the outer diameter of the core 3220 to the inner diameter of the core 4220), corresponds to a ramp or wedge shape in the illustrated embodiment. First gap portion 4224 has a first gap spacing (here, including a respective first height H01 and a respective second height H02) and second gap portion 4226 has a second gap spacing (here, including a respective first height H11 and a respective second height H12), smaller than the first gap spacing. It follows that the second gap portion 4226 may provide for more magnetic field concentration gain than the first gap portion 4224 and, thus, may be more suitable for sensing smaller currents than first gap portion 4224.

Referring to FIG. 2E, a sixth example ferromagnetic core 5220 has opening 3222 and first and second gap portions 5224, 5226 provided in the form a single gap 5223. A lateral cross-section of the gap 5223, taken through a width of core 5220 (e.g., the dimension from the outer diameter of the core 5220 to the inner diameter of the core 5220), corresponds to a ramp or wedge shape in the illustrated embodiment. First gap portion 5224 has a first gap spacing (here, including a respective first height H01 and a respective second height H02) and second gap portion 5226 has a second gap spacing (here, including a respective first height H11 and a respective second height H12), larger than the first gap spacing. It follows that the second gap portion 5226 may provide for less magnetic field concentration gain than the first gap portion 5224 and, thus, may be more suitable for sensing larger currents than first gap portion 5224.

Figure 2F:
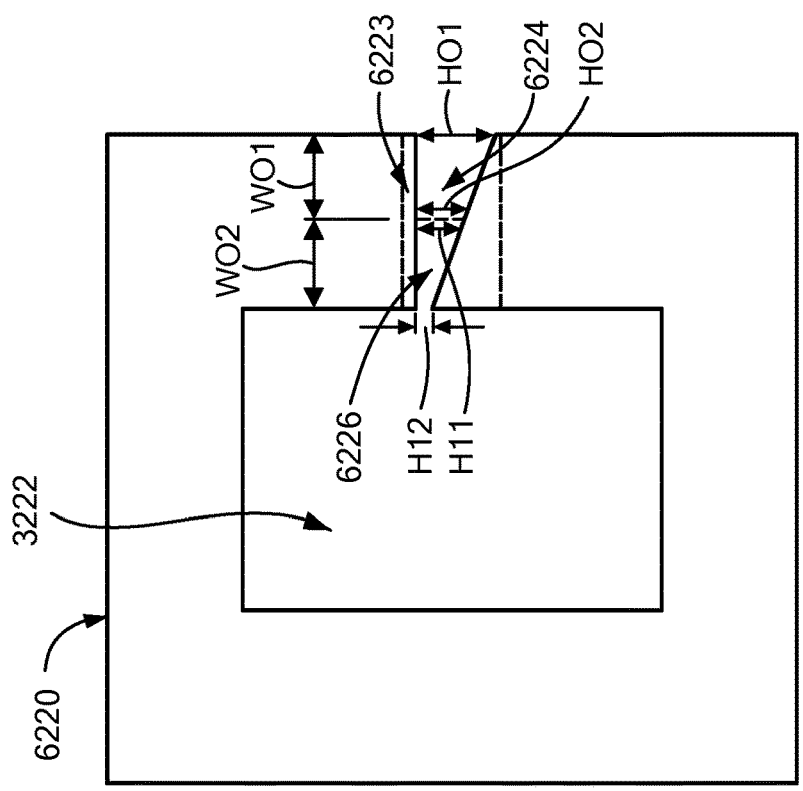
FIG. 2F is a side view of a seventh example configuration of a ferromagnetic core according to the first embodiment of the disclosure.

Referring to FIG. 2F, a seventh example ferromagnetic core 6220 has opening 3222 and first and second gap portions 6224, 6226 provided in the form a single gap 6223. A lateral cross-section of the gap 6223, taken through a width of core 6220 (e.g., the dimension from the outer diameter of the core 6220 to the inner diameter of the core 6220), corresponds to a ramp or wedge shape in the illustrated embodiment. First gap portion 6224 has a first gap spacing (here, including a respective first height H01 and a respective second height H02) and second gap portion 6226 has a second gap spacing (here, including a respective first height H11 and a respective second height H12), smaller than the first gap spacing. It follows that the second gap portion 6226 may provide for more magnetic field concentration gain than the first gap portion 6224 and, thus, may be more suitable for sensing smaller currents than first gap portion 6224.

Referring to FIG. 2G, an eighth example ferromagnetic core 7220 has opening 3222 and first and second gap portions 7224, 7226 provided in the form a single gap 7223. A lateral cross-section of the gap 7223, taken through a width of core 7220 (e.g., the dimension from the outer diameter of the core 7220 to the inner diameter of the core 7220), corresponds to a step shape in the illustrated embodiment. First gap portion 7224 has a first gap spacing (here, including a respective height H01) and second gap portion 7226 has a second gap spacing (here, including a respective height H02), here both the height and width of the second gap spacing being smaller than like dimensions of the first gap spacing. It follows that the second gap portion 7226 may provide for more magnetic field concentration gain than the first gap portion 7224 and, thus, may be more suitable for sensing smaller currents than first gap portion 7224.

While the gap portions of FIGS. 2A-2G (e.g., 1224, 1226, shown in FIG. 2A) physically "meet" at (i.e., run along) the width (e.g., W, shown in FIG. 2A) of the respective ferromagnetic cores in which they are provided (e.g., 1220, shown in FIG. 2), it should be appreciated that gap portions according to the disclosure may alternatively run along the thickness T of the cores (described below in connection with FIGS. 2H and 2I). As discussed, ferromagnetic cores generally have a width W (defined by the difference between an inner diameter of the core and an outer diameter of the core) and a thickness T (that can be the same as or similar to the thickness T shown in FIG. 1).

Referring to FIG. 2H, a ninth example ferromagnetic core 8220 according to the first embodiment of the disclosure has opening 8222 for receiving a current conductor and first and second gap portions 8224, 8226 provided in the form a single gap 8223. Referring also to the cross-sectional view of the ferromagnetic core 8220 shown in FIG. 2I, a lateral cross-section of the gap 8223, taken through a thickness T of core 8220, corresponds to a step shape in the illustrated embodiment.

First gap portion 8224 has a first gap spacing (here, including a respective height H01) and physically "meets" with second gap portion 8226 along a thickness T of the ferromagnetic core 8220. Second gap portion 8226 has a second gap spacing (here, including a respective height H02), larger than the first gap spacing. Similar to the ferromagnetic cores of FIGS. 2-2G, the different gap spacing between the first gap portion 8224 and the second gap portion 8226 may be established by changing one or more dimensions of one gap portion relative to the other. For example, the first and second gap portions may have a same width and thickness, but different gap heights H01, H02, as shown. As another example, the first and second gap portions may have a same width, but different gap heights H01, H02 and thicknesses T01, T02.

In the illustrated embodiment, with the second gap spacing being larger than the first gap spacing, the second gap portion 8226 may provide for less magnetic field concentration gain than the first gap portion 8224. It follows that the second gap portion 8226 may be more suitable for sensing larger currents and a higher current level range than first gap portion 8224.

With each of the above-described ferromagnetic core arrangements of FIGS. 2-2I, dimensions of first and second gap spacings may be selected based on first and second current level ranges to be sensed by the current sensor including the ferromagnetic cores, so as to achieve a desired magnetic field strength within the gap portions when the respective current levels to be sensed flow through the current conductor received by the core opening (e.g., 222, shown in FIG. 2).

Figure 3A:
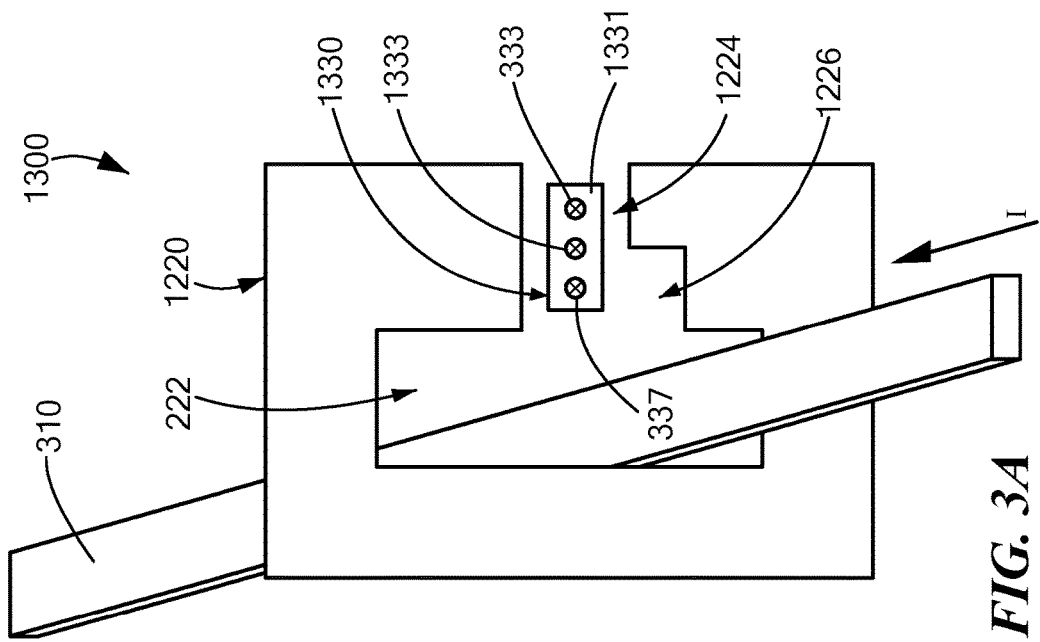
FIG. 3A is a side view of a second example current sensor including the ferromagnetic core of FIG. 2A.
Figure 3:
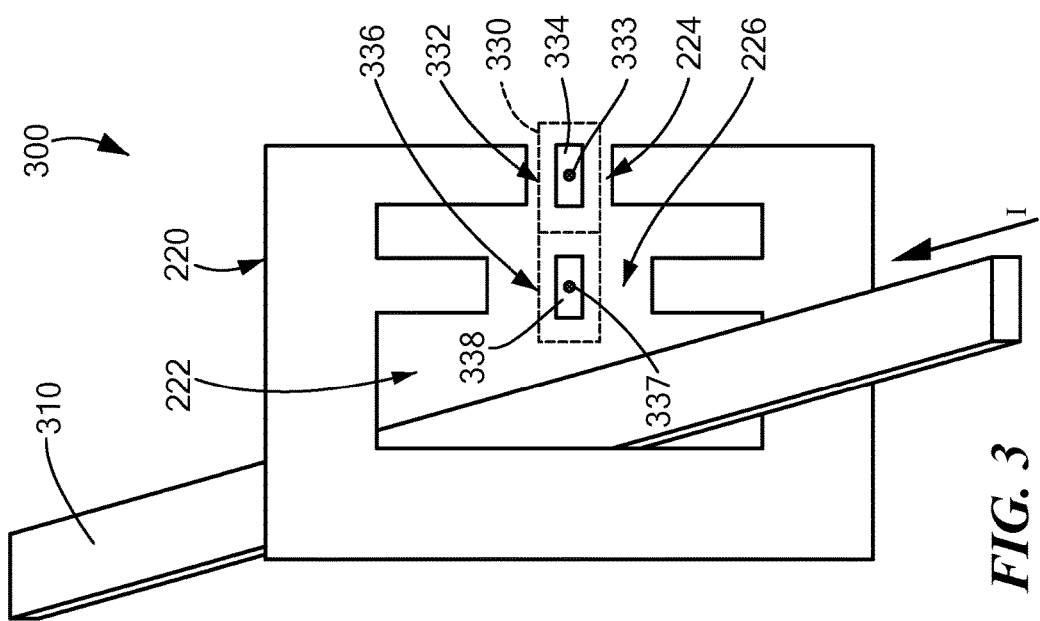
FIG. 3 is a side view of a first example current sensor including the ferromagnetic core of FIG. 2.

Referring to FIG. 3, in which like elements of FIG. 2 are shown having like reference designations, a first example current sensor 300 for sensing a current through a current conductor 310 according to the first embodiment of the disclosure includes ferromagnetic core 220 and a detector 330. The current conductor 310 (e.g., a current carrying wire or busbar), which may be the same as or similar to current conductor 110 of FIG. 1, for example, is disposed in opening 222 of the ferromagnetic core 220. Additionally, at least one first magnetic field sensing element 333 in a first detector portion 332 of the detector 330 is disposed in the first gap portion 224 of the ferromagnetic core 220 and at least one second magnetic field sensing element 337 in a second detector portion 336 of the detector 300 is disposed in the second gap portion 226 of the ferromagnetic core 220. A spacing between the at least one first sensing element 333 and the at least one second sensing element 337 may be based, at least in part, on a spacing between the first and second gap portions 224, 226.

In the illustrated embodiment, the first sensing element 333 is supported a first die 334 and the second sensing element 337 is supported by a second die 338. In some embodiments, the first die 334 and the second die 338 are provided in separate integrated circuit packages. In other embodiments, the first and second die 334, 338 may be provided in the same integrated circuit package.

The first sensing element 333 may take the form of a Hall effect element, for example, and may be configured to generate a first magnetic field signal at an output in response to a first magnetic field generated in the first gap portion 224 (e.g., in response to a current I through the current conductor 310). The first magnetic field signal may be received by circuitry (e.g., circuit 510 shown in FIG. 5, as will be discussed) configured to provide an output signal of the current sensor 300 indicative of the current I through the current conductor 310 (e.g., when the current I is within a first current level range).

Additionally, the second sensing element 337 make take the same or a different form as the first sensing element 333 and may be configured to generate a second magnetic field signal at an output in response to a second magnetic field generated in the second gap portion 226 (e.g., in response to the current I through the current conductor 310). The second magnetic field signal may be received by circuitry (e.g., circuit 530 shown in FIG. 5, as will be discussed) configured to provide an output signal of the current sensor 300 indicative of the current I through the current conductor 310 (e.g., when the current I is within a second, higher current level range). A magnitude of the output signals generated by the circuitry may be substantially proportional to magnitudes of the current I through the current conductor 310.

With the above-described arrangement, the current sensor 300 is configured to sense a current through the current conductor 310 within at least two current level ranges (e.g., programmable current level ranges). Thus, in electronic circuits that require sensing of a current through a current conductor for at least first and second current level ranges, the current sensor 300 alone may be sufficient.

The first and second current level ranges may be based, at least in part, on the gap spacings of the first and second gap portions 224, 226. Additionally, the first and second current level ranges may be based, at least in part, on sensitivities of the first and second detector portions 332, 336. For example, the first detector portion 332 may be programmed to have a first sensitivity (e.g., a sensitivity of about 10 mV/Gauss) as may be suitable for sensing a first current level range. Additionally, the second detector portion 336 may be programmed to have a second, lower sensitivity (e.g., a sensitivity of about 1 mV/Gauss) as may be suitable for sensing a second, higher current level range.

Sensitivities of the first and second detector portions 332, 336 may also depend on the type(s) of sensing elements in the first and second detector portions 332, 336 and the sensing element type. For example, the sensing element 333 in first detector portion 332 may take the form of a magnetoresistance element (e.g., a GMR element) and the sensing element 337 in second detector portion 336 may take the form of a Hall element.

The type of sensing elements may also impact the gap spacings of the first and second gap portions. For example, since a GMR element can be more sensitive to magnetic field changes than a comparable Hall element, a gap portion including a GMR element may have a different gap spacing than a like gap portion including a Hall element.

A spacing or position of the first and second sensing elements 333, 337 within or proximate to the first and second gap portions 224, 226 may affect the first and second magnetic fields sensed by the first and second sensing elements 333, 337, respectively, and, thus, the first and second current level ranges sensed by the sensing elements 333, 337. In some embodiments, the spacing or position of the first and second sensing elements 333, 337 within or proximate to the first and second gap portions 224, 226 is based, at least in part, on type(s) of sensing elements in the first and second detector portions 332, 336 and the axes of maximum sensitivity associated with such sensing elements. A GMR element may, for example, have different spacing or position constraints than a comparable Hall element. As one example, it may be acceptable for a GMR element to be disposed or positioned proximate to or just outside a gap portion to maximize a horizontal component on the GMR, while it may not be acceptable for a comparable Hall element to be disposed or positioned in a similar manner.

It follows that a sensitivity of the first detector portion 332 (i.e., a first circuit portion) may be adjusted, or calibrated based on the current level range to be sensed, the gap spacing of the first gap portion 224, the spacing of the first sensing element 333 within the first gap portion 224, and/or a sensitivity of the first sensing element 333. Additionally, a sensitivity of the second detector portion 336 (i.e., a second circuit portion) may be calibrated based on the gap spacing of the second gap portion 226, the spacing of the second sensing element 337 within the second gap portion 226, and/or a sensitivity of the second sensing element 337. Further, sensitivities of the detector portions 332, 336 may be calibrated based on mechanical placement tolerances of the detector portions 332, 336 in the first and second gap portions 224, 226.

While the current I is shown as flowing through the current conductor 310 in a single direction in the illustrated embodiment, it should be appreciated that the current flow may be bi-directional in other embodiments. Additionally, while the first sensing element 333 and the second sensing element 337 are shown and described as provided on separate die in the illustrated embodiment, it will become apparent from figures below that the first sensing element 333 and the second sensing element 337 may be provided on a same die in some embodiments and in a same integrated circuit package in some embodiments.

Referring to FIG. 3A, in which like elements of FIGS. 2A and 3 are shown having like reference designations, a second example configuration of a current sensor 1300 according to the first embodiment of the disclosure includes ferromagnetic core 1220 and a detector 1330. Detector 1330 has at least one first sensing element 333 disposed in first gap portion 1224 of ferromagnetic core 1220 and at least one second sensing element 337 disposed in second gap portion 1226 of ferromagnetic core 1220. Additionally, detector 1330 has at least one third, central magnetic field sensing element 1333 disposed between the first and second sensing elements 333, 337. In some embodiments, the three sensing elements 333, 337, and 1333 are coupled for differential magnetic field sensing, with central element 1333 used in both channels of the differential magnetic field sensing arrangement.

In some embodiments, the detector 1330 may take the form of an integrated circuit. Additionally, in some embodiments the first sensing element 333, the second sensing element 337, and the third sensing element 1333 are each supported by a single die 1331.

The first sensing element 333 and the second sensing element 337 are each responsive to magnetic fields generated in their respective gap portions (e.g., in response to a current I through a current conductor 310 disposed in opening 222 of ferromagnetic core 1220) to generate magnetic field signals indicative of the magnetic fields in the gap portions. Additionally, third sensing element 1333 is responsive to a magnetic field (e.g., a third magnetic field) generated between the first and second gaps portions 1224, 1226 to generate a magnetic field signal indicative of the magnetic field. Depending upon a positon of the third sensing element 1333, the third sensing element 1333 may sense varying magnetic fields. For example, in embodiments when the third sensing element 1333 is positioned proximate to the first sensing element 333 in first gap portion 1224, the third sensing element 1333 may sense a transition, which may include a peak, of the magnetic field generated in the first gap portion 1224. Additionally, in embodiments in which the third sensing element 1333 is positioned substantially equidistantly between the first sensing element 333 and the second sensing element 337, the third sensing element 1333 may be calibrated to sense "interfering" magnetic fields (i.e., magnetic fields which are not related to the current to be sensed) which may be generated between the first and second gap portions 1224, 1226.

Further, in embodiments in which the third sensing element 1333 is provided as a sensing element having a different axis of maximum sensitivity than the first sensing element 333 and/or the second sensing element 337, and is provided within or proximate to a same gap portion as one of the sensing elements to which it has a different axis of maximum sensitivity, a combination of magnetic field signals generated by of the third sensing element 1333 and the other sensing element may be used by circuitry to determine a current I through the current conductor 310. Such may, for example, provide for a more precise current measurement due to the multiple magnetic field dimensions being sensed by the sensing elements.

Circuitry (e.g., circuits 510, 530 shown in FIG. 5A, as will be discussed) may be coupled to receive the magnetic field signals from respective outputs of the first, second, and third sensing elements 333, 337, 1333 and configured to generate an output of the current sensor 1300 (i.e., a current sensor output signal) indicative of the current I through the current conductor 310. In a differential sensing arrangement, for example, the current sensor output signal may be indicative of outputs of the first sensing element 333 and the third sensing element 1333 when the current I through the current conductor is within a first current level range. Additionally, the current sensor output signal may be indicative of outputs of the second sensing element 337 and the third sensing element 1333 when the current I through the current conductor is within a second, higher current level range. Thus, similar to current sensor 300 of FIG. 3, the current sensor 1300 is configured to sense a current through the current conductor 310 within at least two current level ranges.

A sensitivity of a first detector portion including first sensing element 333 may be calibrated based on the current level range to be sensed by the first detector portion, the gap spacing of the first gap portion 1224, the spacing of the first sensing element 333 within the first gap portion 1224, and/or a sensitivity of the first sensing element 333. Additionally, a sensitivity of a second detector portion including second sensing element 337 may be calibrated based on the current level range to be sensed by the second detector portion, the gap spacing of the second gap portion 1226, the spacing of the second sensing element 337 within the second gap portion 1226, and/or a sensitivity of the second sensing element 337.

Figure 3B:
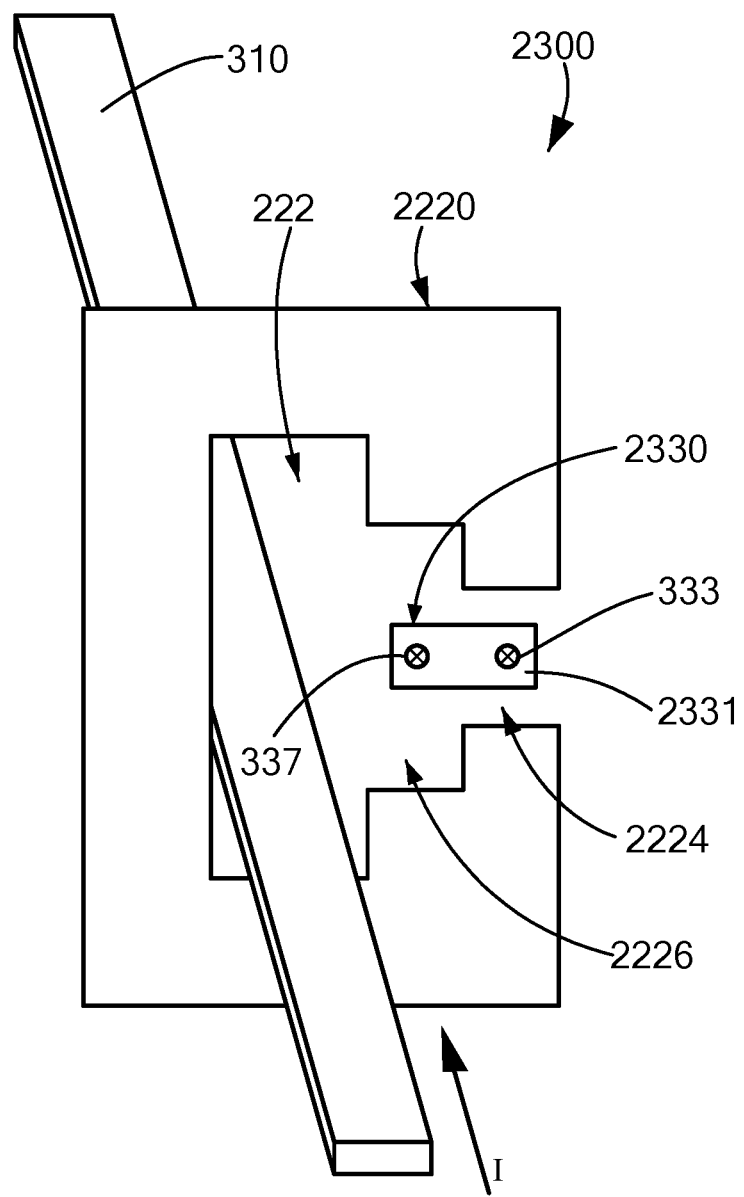
FIG. 3B is a side view of a third example current sensor including the ferromagnetic core of FIG. 2B.

Referring to FIG. 3B, in which like elements of FIGS. 2B and 3 are shown having like reference designations, a third example configuration of a current sensor 2300 according to the first embodiment of the disclosure includes ferromagnetic core 2220 and a detector 2330. Detector 2330 has at least one first sensing element 333 disposed in first gap portion 2224 of ferromagnetic core 2220 and at least one second sensing element 337 disposed in second gap portion 2226 of ferromagnetic core 2220. Additionally, current conductor 310 is received in opening 222 of the ferromagnetic core 2220. In some embodiments, the detector 2330 may take the form of an integrated circuit. Additionally, in some embodiments the first sensing element 333 and the second sensing element 337 are each supported by a single die 2331.

The first sensing element 333 and the second sensing element 337 are each responsive to magnetic fields generated in their respective gap portions (e.g., in response to a current I through the current conductor 310) to generate magnetic field signals indicative of the magnetic fields in the gap portions. Additionally, circuitry (e.g., circuits 510, 530 shown in FIG. 5, as will be discussed) may be coupled to receive the magnetic field signals from respective outputs of the first and second sensing elements 333, 337 and configured to generate an output of the current sensor 2300 (i.e., a current sensor output signal) indicative of the current I through the current conductor 310. The current sensor output signal may, for example, be indicative of an output of the first sensing element 333 when the current I through the current conductor is within a first current level range. Additionally, the current sensor output signal may be indicative of an output of the second sensing element 337 when the current I through the current conductor is within a second, different current level range. In some embodiments, the second current level range may be a lower current level range than the first current level range. Thus, similar to current sensors 300 and 1300 of FIGS. 3 and 3A, the current sensor 2300 is configured to sense a current through the current conductor 310 with at least two current level ranges.

A sensitivity of a first detector portion including first sensing element 333 may be calibrated based on the current level range to be sensed by the first detector portion, the gap spacing of the first gap portion 2224, the spacing of the first sensing element 333 within the first gap portion 2224, and/or a sensitivity of the first sensing element 333. Additionally, a sensitivity of a second detector portion including second sensing element 337 may be calibrated based on the current level range to be sensed by the second detector portion, the gap spacing of the second gap portion 2226, the spacing of the second sensing element 337 within the second gap portion 2226, and/or a sensitivity of the second sensing element 337.

It should be appreciated that the current sensors 300, 1300, and 2300 described above with FIGS. 3-3B are but three of many potential configurations of current sensors in accordance with the concepts, systems, circuits and techniques described herein. As one example, at least one of the first and second sensing elements 333, 337 in current sensors 300, 1300, and 2300 can include a plurality of sensing elements. As another example, the current sensors 300, 1300, and 2300 can include more than first, second, and third sensing elements 337, 337, 2333 and be configured to sense more than two current level ranges of current through a current conductor.

Figure 4:
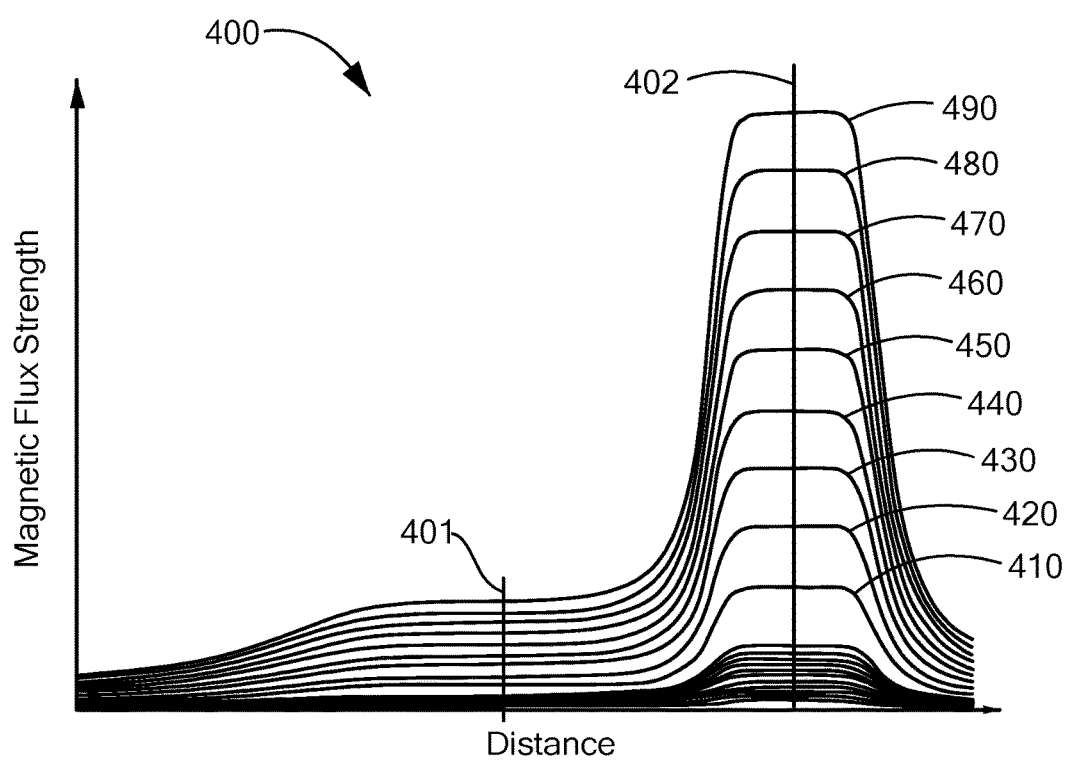
FIG. 4 shows illustrative signal waveforms of magnetic fields that may be generated in example gap portions of a ferromagnetic core according to the first embodiment of the disclosure in response to a current through a current conductor.

Referring to FIG. 4, illustrative signal waveforms of magnetic fields that may be generated in gap portions of a ferromagnetic core (e.g., 1220, shown in FIG. 2A) are shown in a plot 400. The plot 400 has a horizontal axis with a scale in distance units and a vertical axis with a scale in magnetic field strength units. The horizontal axis may, for example, be illustrative of various positions at which a sensing element, or a plurality of sensing elements, can be disposed relative to gap portions of a ferromagnetic core. For example, a positon 401 may correspond to an example position of a first sensing element (e.g., 333, shown in FIG. 3A) or a differential pair of sensing elements (e.g., 333, 1333, shown in FIG. 3A) in a first gap portion (e.g., 1224, shown in FIG. 3A). Additionally, a position 402 may correspond to an example position of a second sensing element (e.g., 337, shown in FIG. 3A) or a differential pair of sensing elements (e.g., 337, 1333, shown in FIG. 3A) in a second gap portion (e.g., 1226, shown in FIG. 3A). As previously discussed, sensing element spacing within a gap portion affects magnetic field strength sensed by the sensing element(s) and, thus, a resulting magnetic field signal generated by the sensing element(s).

The plot 400 includes a plurality of signals (e.g., 410, 420, 430, 440, 450, 460, 470, 480, 490) representative of different magnetic field strengths generated in the first and second gap portions in response to different respective currents through a current conductor. Signal 410 may, for example, be representative of a first example magnetic field generated in the gap portions in response to a first current through a current conductor disposed in an opening (e.g., 222, shown in FIG.

2A) of the ferromagnetic core. Additionally, signal 490 may be representative of a second example magnetic field generated in the gap portions in response to a second, higher current through the current conductor.

As illustrated, strengths of the magnetic fields sensed by the sensing elements vary depending on a spacing or position of the sensing element(s) within the gap portions. For example, at position 401 the magnetic fields sensed by the sensing element(s), as represented by signals 410, 420, 430, 440, 450, 460, 470, 480, 490, for example, have a first magnetic field strength. Additionally, at position 402 the magnetic fields sensed by the sensing element(s) have a second, higher magnetic field strength. Further, accuracy of the magnetic fields sensed by the sensing element(s) at each position 401, 402 and, thus, slopes of the signals 410, 420, 430, 440, 450, 460, 470, 480, 490 shown in FIG. 4, may vary based upon a number of sensing elements (e.g., one or two) sensing the magnetic fields within the gap portions.

The foregoing may, for example, be due to a first gap portion represented by position 402 having a first gap spacing and a second gap portion represented by position 401 having a second, larger gap spacing. Generally, a larger gap spacing provides for less of a concentration gain. Additionally, the foregoing may be due to a spacing of a first sensing element or a differential pair of sensing elements within the first gap portion and a spacing of a second sensing element or a differential pair of sensing elements within the second gap portion. Further, the foregoing may be due to the first sensing element(s) disposed in the first gap portion having a first output sensitivity (i.e., response characteristic to a magnetic field) and the second sensing element(s) disposed in the second gap portion having a second, different output sensitivity. It follows that the magnetic fields sensed by the sensing elements and, thus, current levels of current signals sensed by a current sensor including the sensing elements can be adjusted in multiple ways.

Figure 5:
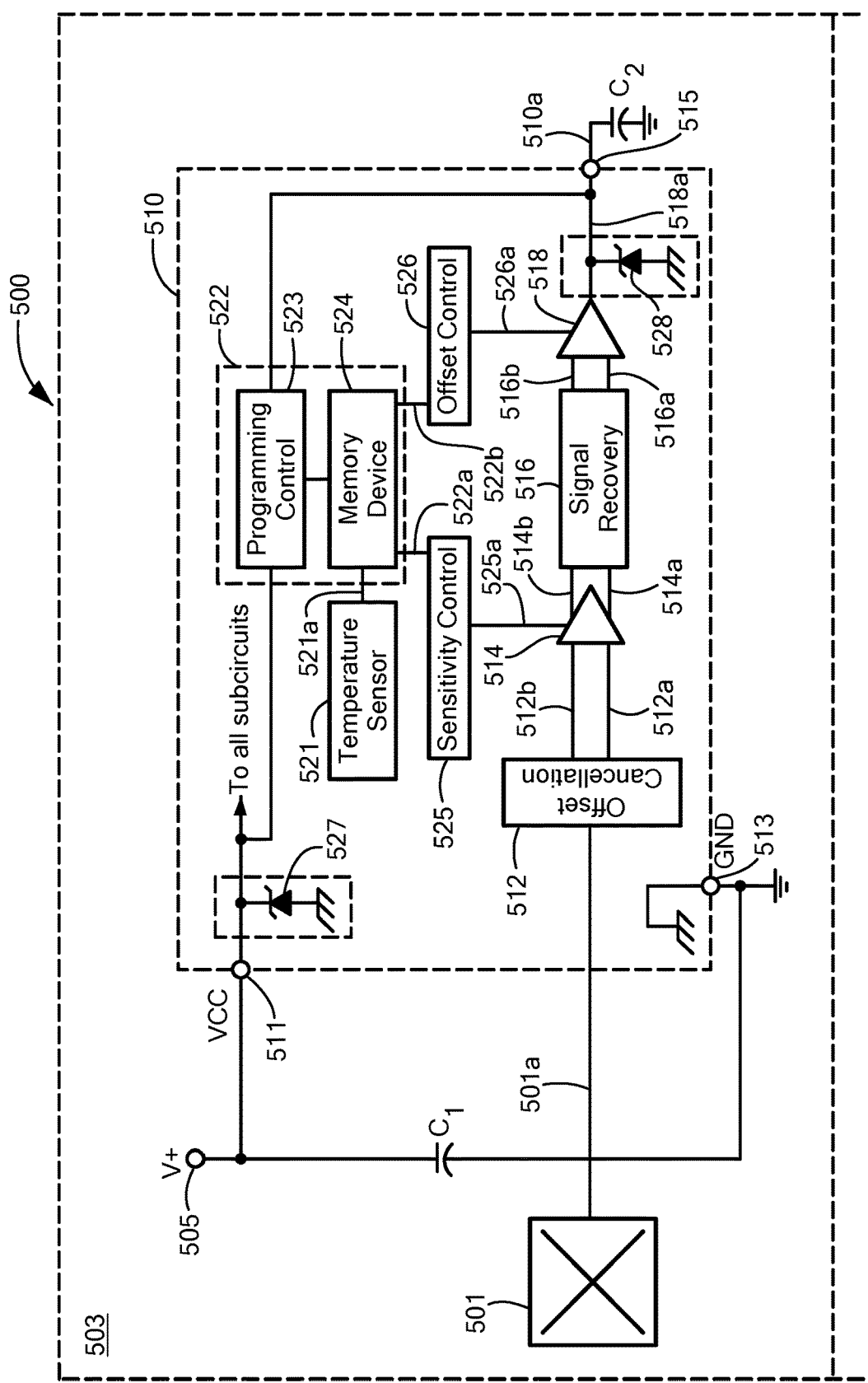
FIG. 5 shows a first example configuration of a detector according to the first embodiment of the disclosure.
Figure 5:
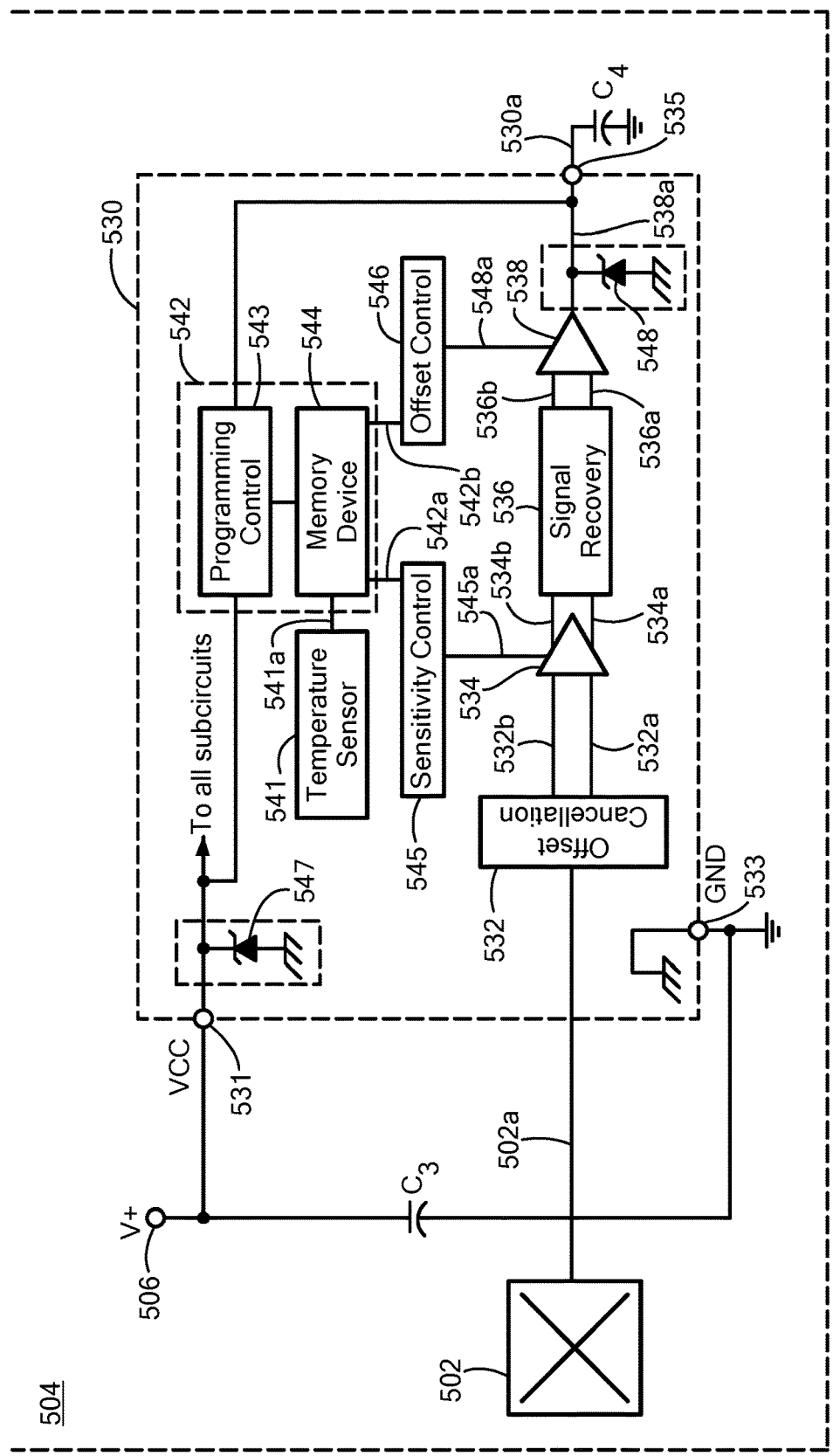

Referring to FIG. 5, a first example detector 500 which may be provided in a current sensor according to the first embodiment of the disclosure (e.g., 1300, shown in FIG. 3A) includes at least one first magnetic field sensing element 501 and at least one second magnetic field sensing element 502, each of which may be the same as or similar to the at least one first and second magnetic field sensing elements described above in conjunction with FIGS. 1-4. The first sensing element 501 may be disposed in a first gap portion (e.g., 1124, shown in FIG. 3A) of a ferromagnetic core (e.g., 1220, shown in FIG. 3A) according to the disclosure and the second sensing element 502 may be disposed in a second gap portion (e.g., 1226, shown in FIG. 3A) of the ferromagnetic core.

The detector 500 also includes circuitry (here, circuits 510 and 530) responsive to respective outputs of first sensing element 501 and second sensing element 502 to generate output signals (here, output signals 510a, 530a) indicative of a current through a current conductor (e.g., 310, shown in FIG. 3A) disposed through a substantially central opening within the ferromagnetic core (e.g., 222, shown in FIG. 3A) and being sensed by the detector 500. Circuit 510 (i.e., a first example circuit portion) has an input coupled to an output of the first sensing element 501 and an output coupled to a corresponding output of the current sensor (not shown). Additionally, circuit 530 (i.e., a second example circuit portion) has an input coupled to an output of the second sensing element 502 and an output coupled to a corresponding output of the current sensor. In some embodiments, the detector 500 is provided in the form of an integrated circuit, with the first sensing element 501 supported by a first die 503 and the second sensing element 502 supported by a second die 504. The first die 503 and the second die 504 may be provided in a single integrated circuit package or in separate integrated circuit packages.

The first sensing element 501 (e.g., a Hall effect element) may be driven configured to generate a respective first magnetic field signal 501a in response to a first magnetic field generated in the first gap portion of the ferromagnetic core in response to a current through the current conductor. Additionally, the second sensing element 502 may be configured to generate a respective second magnetic field signal 502a in response to a second magnetic field generated in the second gap portion of the ferromagnetic core in response to the current through the current conductor. The magnetic field signals 501a, 502a may be single-ended signals or differential signals. Additionally, one of the magnetic field signals (e.g., 501a) may correspond to a so-called "high gain" signal indicative of current sensed in a first current range, and the other one of the magnetic field signals (e.g., 502a) may correspond to a so-called "low gain" signal indicative of current sensed in a second, higher current range.

The first magnetic field may have a magnitude greater than the second magnetic field and vary depending on the current through the current conductor. Additionally, the first magnetic field may vary depending on dimensions of the first gap portion and positions or a spacing of the sensing element 501 within the first gap portion, and an output sensitivity (e.g., a programmed output sensitivity) of the sensing element 501. Similarly, the second magnetic field may vary depending on dimensions of the second gap portion and positions or a spacing of the sensing element 502 within the second gap portion, and an output sensitivity of the sensing element 502. While the first and second sensing elements 501, 502 are depicted as Hall effect elements in the illustrated embodiment, in some embodiments the sensing elements are, for example, provided as other types of sensing elements, such as magnetoresistance elements or magnetotransistors. The sensing elements 501, 502 may take any form suitable for detecting a current through a current conductor by sensing first and second magnetic fields in first and second ferromagnetic core gap portions, respectively.

Circuits 510 and 530 are coupled to receive the first magnetic field signal 501a generated by the first sensing element 501 and the second magnetic field signal 502a generated by the second sensing element 502, respectively, as shown. Circuit 510 generates a detector output signal 510a indicative of the first magnetic field and of the current through the current conductor when the current is within a first current level range. Additionally, circuit 530 generates a detector output signal 530a indicative of the second magnetic field and of the current through the current conductor is within a second, high current level range.

Taking the circuit 510 as representative of each circuit 510, 530, the circuit 510 includes an offset correction circuit 512 coupled to receive the first magnetic field signal 501a (e.g., from first sensing element 501 or a sensing element pair including the first sensing element 501) and configured to generate a first offset corrected signal (here, differential signal 512a, 512b) indicative of the first magnetic field. A first amplifier 514 (e.g., a low noise amplifier) may be coupled to receive the first offset corrected signal and configured to generate a first amplified signal (here, differential signal 514a, 514b). Additionally, a signal recovery circuit (e.g., a low pass filter) 516 is coupled to receive the first amplified signal and configured to generate a filtered signal (here, differential signal 516a, 516b). Further, a second amplifier 518 is coupled to receive the filtered signal and configured to generate a second amplified signal 518a. The second amplified signal 518a is provided to a corresponding output of the circuit 510 (e.g., third terminal 515, as will be discussed) as a detector output signal 510a. The detector output signal 510a can be provided in a variety of signal formats, including, but not limited to, a SENT format, an I²C format, a PWM format, or a two-state binary format, and may be provided as a signal indicative of the first magnetic field generated in the first gap portion.

Circuit 510 also includes a temperature sensor 521, a controller 522, a sensitivity control circuit 525, and an offset control circuit 527. The temperature sensor 521 may be disposed proximate to the first sensing element 501 and configured to generate a temperature signal 521a indicative of a temperature experienced by the first sensing element 501. Additionally, the controller 522 may be coupled to receive the temperature signal 521a and configured to generate corresponding gain correction coefficients and offset correction coefficients (e.g., to compensate for temperature induced changes in sensitivity of the sensing element 501 and offset in the magnetic field signal 501a generated by the sensing element 501). The gain correction coefficients and the offset correction coefficients may be stored in a memory device 524 (e.g., onboard EEPROM), for example, based on instructions from controller logic 523 in the controller 522.

The sensitivity control circuit 525 (e.g., a programmable sensitivity control circuit) can be coupled to receive stored gain correction coefficients from memory device 524 of controller 522 via a signal line 522a and configured to control a gain level of the first amplified signal generated by the first amplifier 514 (e.g., through a gain control signal 525a) in order to thereby adjust the sensitivity of the circuit 510. Additionally, the offset control circuit 526 (e.g., a programmable offset control circuit) can be coupled to receive stored offset correction coefficients from the memory device 524 via a signal line 522b and configured to attenuate an offset of the second amplified signal 518a generated by the second amplifier 518 (e.g., through an offset control signal 526a). It follows that temperature sensor 521, a controller 522, sensitivity control circuit 525 and offset control circuit 524 may be used in circuit 510 to provide a temperature compensated output (i.e., output 510a).

Circuit 510 can also include a voltage regulator (here, represented by a Zener diode 527) coupled to a voltage source 505 at a first terminal 511 (e.g., a power terminal) of circuit 510 and configured to generate a regulated voltage as may be used to power one or more components in the circuit 510. A capacitor C1 (e.g., a bypass capacitor) can be coupled between the first terminal 511 and a second terminal 513 (e.g., a ground terminal) of the circuit 510. Additionally, an electrostatic discharge (ESD) protection circuit (here, a Zener diode 528) may be coupled proximate to the third terminal 515 (e.g., a signal terminal) of circuit 510 to provide ESD protection to the circuit 510. Further, a capacitor C2 (e.g., a load capacitor) may be coupled to the third terminal 515.

Circuit 530 is configured to generate a detector output signal 530a in a manner similar to how the circuit 510 generates the detector output signal 510a. However, since the first sensing element 501 contributes to the detector output signal 510a and the second sensing element 502 contributes to the detector output signal 530a in the embodiment shown, the detector output signal 510a is generated in response to the first magnetic field in the first gap portion and the detector output signal 530a is generated in response to the second magnetic field in the second gap portion.

In some embodiments, the detector output signals 510a, 530a may be received by circuitry (e.g., analog, digital or mixed-signal circuitry) (not shown) for further processing. For example, the detector output signals 510a, 530a may be received by an output protocol circuit (not shown) coupled to receive the first detector output signal 510a and the second detector output signal 530a and configured to generate a combined current sensor output signal. Such a combined current sensor output signal may be indicative of the first detector output signal 510a when the current through the current conductor is within a first current level range. Additionally, the current sensor output signal may be indicative of the second detector output signal 530a when the current through the current conductor is within a second, higher current level range. In embodiments in which the current sensor including the detector 500 is provided in a linear current sensor, for example, the current sensor output signal may be proportional to the current through the current conductor. The current sensor output signal may be received by other circuitry (e.g., an engine control unit), for example.

Further, in some embodiments, the current sensor including detector 500 may be a programmable current sensor and sensitivities of circuits 510, 530 (i.e., first and second detector portions) and, thus, the current sensor output, may be adjusted, or calibrated based on the current level ranges to be sensed, the gap spacings of the gap portions in which the sensing elements 501, 502 are disposed, the spacings of the sensing elements 501, 502 within the gap portions, and/or sensitivities of the sensing elements 501, 502. In one embodiment, the sensitivities of circuits 510, 530 are adjusted prior to insertion of the sensing elements 501, 502 into the gap portions. In another embodiment, the sensitivities of circuits 510, 530 are adjusted subsequent to insertion of the sensing elements 501, 502 into the gap portions. For example, the sensitivity of circuit 510 may be adjusted through a process including generating a first predetermined current through a current conductor to be sensed by the current sensor and adjusting a sensitivity of the circuit 510 (e.g., through sensitivity control circuit 525) to achieve a desired detector output signal 510a and current sensor output signal based on the first predetermined current.

With the above arrangement, the detector 500 is capable of detecting a current through a current conductor within at least two current level ranges.

While circuits 510, 530 are provided in the form of electronic circuits with analog and digital circuit portions, it will be appreciated that the particular delineation of which circuit functions are implemented in an analog fashion or with digital circuitry and signals can be varied. For example, one or more portions of the circuit 510 (e.g., offset correction circuit 512, first amplifier 514, signal recovery circuit 516, and second amplifier 518) may be provided as part of the controller 522. The controller 522 can, for example, perform the function, operation, or sequence of operations of one or more portions of the circuit 510. Additionally, some of the illustrated circuit functions can be implemented on separate circuits (e.g., additional substrates within the same integrated circuit package, or additional integrated circuit packages, and/or on circuit boards).

Additionally, while the first amplified signal, the filtered signal, and the second amplified signal are shown as differential signals in the illustrated embodiment, it should be appreciated that these signals can alternatively be single-ended signals. Similarly, while the first magnetic field signal 501a and the second amplified signal 518a are shown as single-ended signals in the illustrated embodiment, it should be appreciated that these signals can alternatively be differential signals.

Figure 5A:
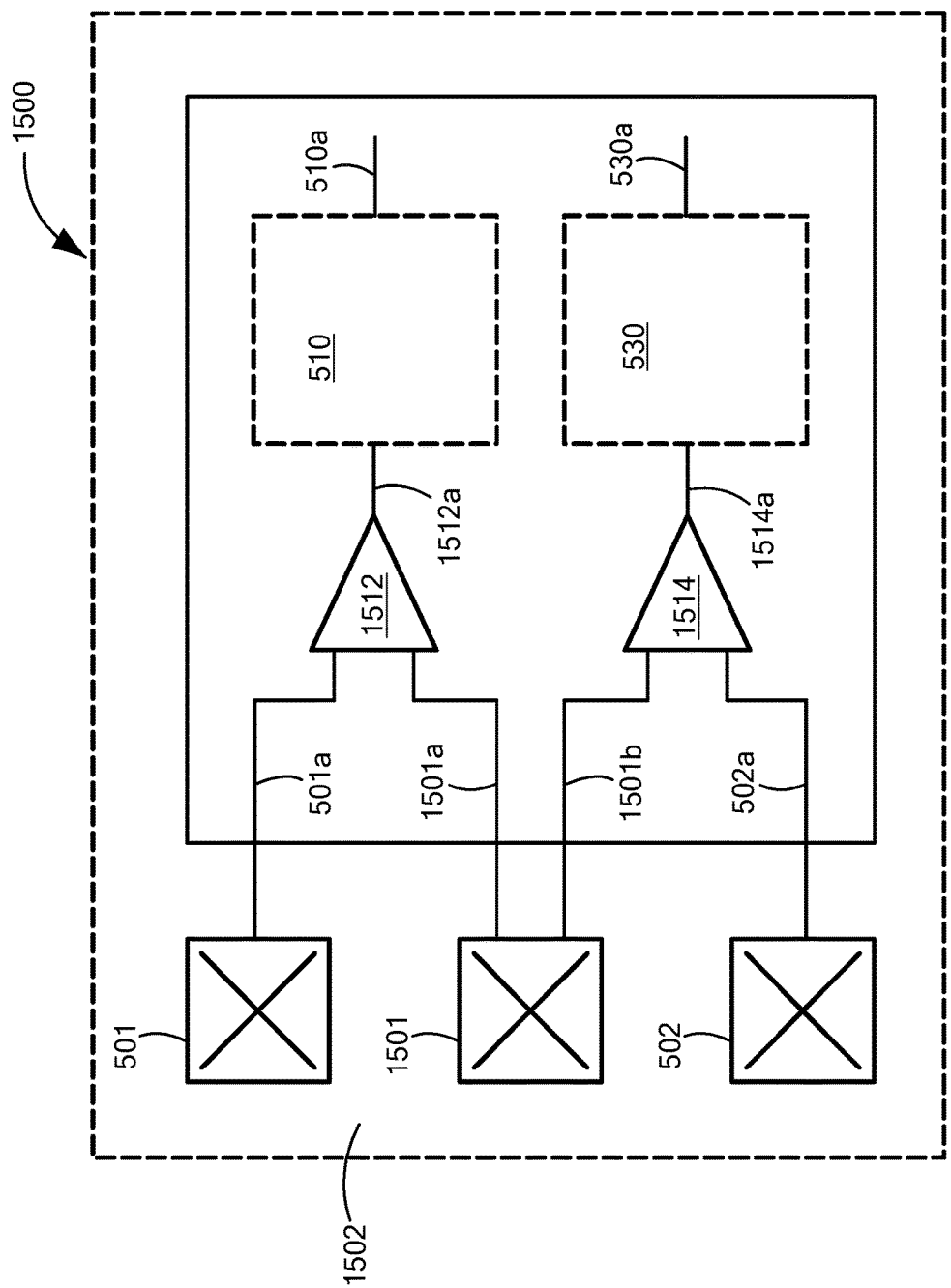
FIG. 5A shows a second example configuration of a detector according to the first embodiment of the disclosure.

Referring to FIG. 5A, in which like elements of FIG. 5 are shown having like reference designations, another example detector 1500 for sensing a current through a current conductor includes a first sensing element 501, a second sensing element 502 and a third, central sensing element 1501 coupled in a differential sensing arrangement. The detector 1500 also includes a circuit 1510 coupled to respective outputs of the sensing elements 501, 502, 1501 and configured to generate output signals (here, detector output signals 510a, 510b) indicative of the current through the current conductor. In some embodiments, the detector 1500 may be provided in the form of an integrated circuit and the sensing elements 501, 502, 1501 may be provided on a single die 1502.

The first sensing element 501 is disposed in a first gap portion of a ferromagnetic core according to the disclosure and configured to generate a respective first magnetic field signal 501a in response to a first magnetic field generated in the first gap portion in response to a current through the current conductor. Additionally, the second sensing element 502 is disposed in a second gap portion of the ferromagnetic core and configured to generate a respective second magnetic field signal 502a in response to a second magnetic field generated in the second gap portion in response to the current through the current conductor. Further, the third sensing element 1501, which may be used as a so-called reference sensing element in the differential sensing arrangement, for example, is disposed between the first and second gap portions and configured to generate a differential magnetic field signal 1501a, 1501b in response to a third magnetic field generated in a position between the first and second gap portions. In one embodiment, detector 1500 is calibrated based upon a particular placement of the third sensing element 1501 with respect to at least one of the first sensing element 501 and second sensing element 502 (e.g., to reduce or substantially eliminate any output errors which may occur due to the placement).

In circuit 1510, a first circuit portion including an amplifier 1512 and a circuit 510 is responsive to magnetic field signals generated by first and third sensing elements 501, 1501 and a second circuit portion including an amplifier 1514 and a circuit 530 is responsive to magnetic field signals generated by second and third sensing elements 502, 1501. In particular, in the first circuit portion, amplifier 1512 (e.g., a differential amplifier) is coupled to receive a differential magnetic field signal 501a, 1501a from respective outputs of the first and third sensing elements 501, 1501 and configured to generate a first differentially sensed signal 1512a. Additionally, circuit 510 is coupled to receive the first differentially sensed signal 1512a and configured to generate a first detector output signal 510a. The first detector output signal 510a may be indicative of the first magnetic field in the first gap portion.

In the second circuit portion, amplifier 1514 is coupled to receive a differential signal 501a, 1501a from respective outputs of the second and third sensing elements 502, 1501 and configured to generate a second differentially sensed signal 1514a. Additionally, circuit 530 is coupled to receive the second differentially sensed signal 1514a and configured to generate a second detector output signal 530a. The second detector output signal 530a may be indicative of the second magnetic field in the second gap portion.

In some embodiments, the detector output signals 510a, 530a may be received by an output protocol circuit (not shown) coupled to receive the first detector output signal 510a and the second detector output signal 530a and configured to generate a current sensor output signal indicative of the current through the current conductor for at least a first current level range and a second, higher current level range. For example, the current sensor output signal may be indicative of the first detector output signal 510a when the current through the current conductor is within a first current level range, and the current sensor output signal may be indicative of the second detector output signal 530a when the current through the current conductor is within a second, high current level range.

Similar to the sensing arrangement described in FIG. 5, with the above arrangement, the detector 1500 is capable of detecting a current through a current conductor for at least two current level ranges.

While three sensing elements 501, 502, 1501 are shown in FIG. 5A, it should be appreciated that two or more sensing elements can be used. For example, in an embodiment using only two magnetic field sensing elements (e.g., 501, 502), only one sensing element (e.g., 501) can be coupled to the first amplifier 1512 and the other sensing element (e.g., 502) can be coupled to the second amplifier 1514.

Additionally, it should be appreciated that the detectors 500, 1500 described above with FIGS. 5 and 5A are but two of many potential configurations of detectors in accordance with the concepts, systems, circuits and techniques described herein. As one example, at least one of the first and second sensing elements 501, 502 in detectors 500, 1500 can include a plurality of sensing elements. As another example, the detectors 500, 1500 can include more than first, second, and third sensing elements 501, 502, 1501 and be configured to sense more than two current level ranges of a current through a current conductor. As a further example, first and second sensing elements 501, 502 can be coupled in a differential sensing arrangement and configured to sense a first current level range through the current conductor, and third sensing element 1501 can be decoupled from the first and second sensing elements 501, 502 and configured to sense a second, different current level range through the current conductor, as will be described further below in connection with current sensors according to a second embodiment of the disclosure.

Figure 6:
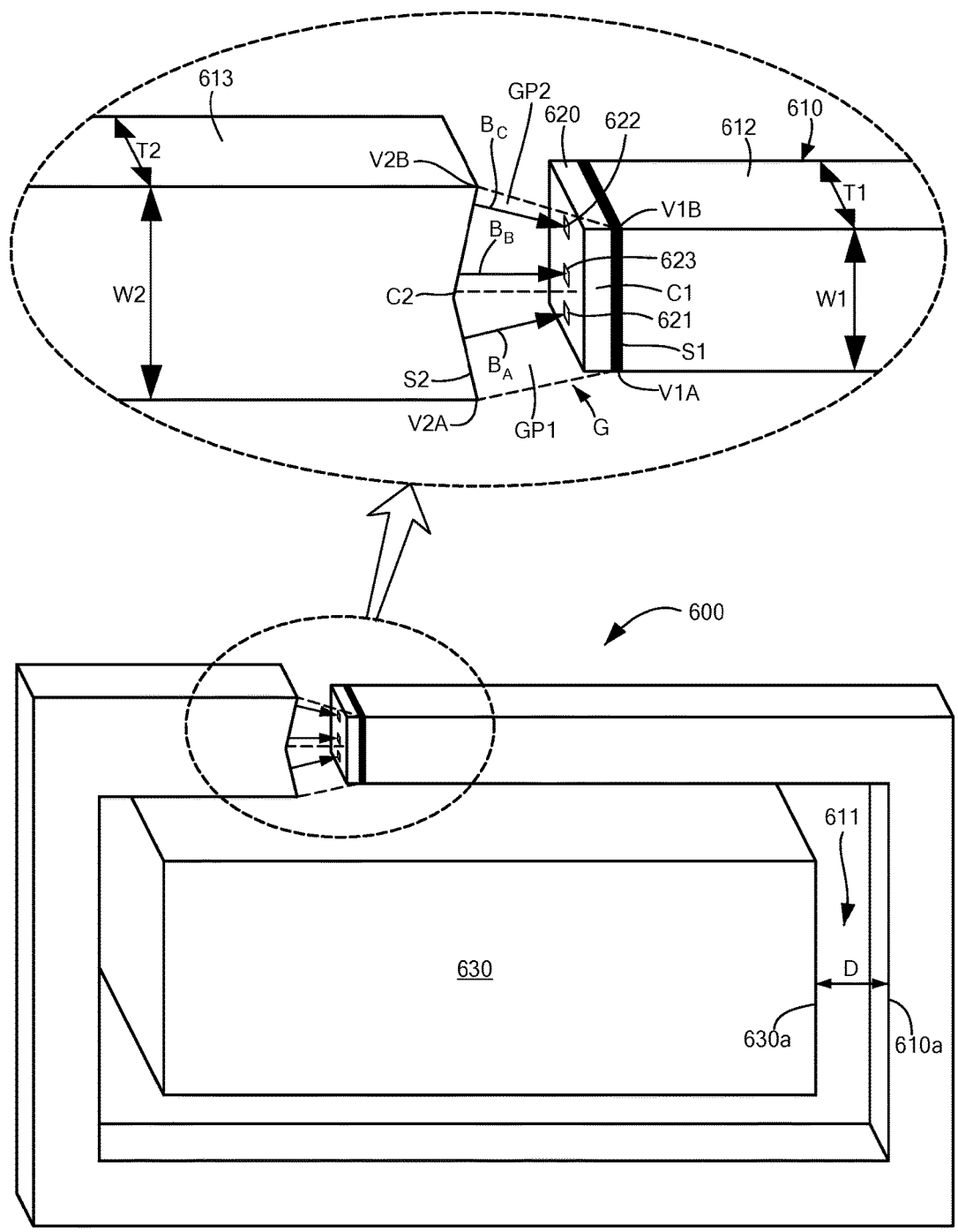
FIG. 6 is a side view of an example current sensor according to the disclosure.

Referring to FIG. 6, an example current sensor 600 according to an embodiment includes a ferromagnetic core 610 and a detector 620. The ferromagnetic core 610 (i.e., a magnetic concentrator) has an opening 611 for receiving a current conductor 630 (e.g., a current-conducting wire or bus bar) carrying a current to be sensed by detector 620. The ferromagnetic core 610 also has a gap G, in which at least a portion of the detector 620 is disposed.

The ferromagnetic core 610 may comprise a variety of magnetic field concentrating materials including, for example, a ferrite material, laminated steel, and an iron alloy. Additionally, the ferromagnetic core 610 has dimensions which may be selected based on dimensions associated with the application, dimensions of the current conductor 630, and a range of current levels through the current conductor 630 to be sensed. For example, the core 610 may have dimensions selected to provide a predetermined distance D between a surface 630a of the current conductor 630 and a surface 610a of the core. Such predetermined distance D may be a minimum distance selected to prevent the core 610 from saturating at relatively high currents.

In the illustrated embodiment, the ferromagnetic core 610 has a first portion 612 with a first associated width W1 (defined by the difference between an inner length or diameter of the core 610 proximate to the first core portion 612 and an outer length or diameter of the core 610 proximate to the first core portion 612) and thickness T1. The ferromagnetic core 610 also has a second portion 613 with a second associated width W2 (defined by the difference between an inner length or diameter of the core 610 proximate to second core portion 613 and an outer length or diameter of the core 610 proximate to the second core portion 613) and thickness T2. In some embodiments, the core dimensions and cross sections (T1*W1, T2*W2) are selected to be as large as an application allows, as generally the larger the cross section, the higher the core saturation point.

Magnetic fields generated in the ferromagnetic core 610 are typically concentrated in the gap G. The gap G has a first gap surface S1 (here, a substantially flat surface) and a second, opposing gap surface S2 (here, a curved, or angled surface having a substantially V shape) between which a first gap portion GP1 and a second gap portion GP2 are provided. First gap portion GP1 can be defined between a first air gap height, or simply gap height (between a first vertex V1A of the first gap surface S1 and a first vertex V2A of the second gap surface S2) and a second gap height (between a center point C1 of the first gap surface S1 and a center point C2 of the second gap surface S2). Additionally, second gap portion GP2 can be defined between the second gap height (between the center point C1 of the first gap surface S1 and the center point C2 of the second gap surface S2) and a third gap height (between a second vertex V1B of the first gap surface S1 and a second vertex V2B of the second gap surface S2). The first gap height is substantially the same as the third gap height in the illustrated embodiment (i.e., the first gap portion GP1 is symmetrical to the second gap portion GP2). Thus, the first and second gap portions GP1, GP2 have a same or similar spacing between opposing surfaced S1, S2 and may provide a substantially same magnetic field concentration. As previously discussed, the air gap directly affects the gain of the magnetic concentration. In particular, for a constant cross-sectional area, the smaller the air gap, the higher the concentration.

In the illustrated embodiment, the second gap height is larger than the first and third gap heights. Thus, magnetic fields may be less concentrated between the center point C1 of the first gap surface S1 and the center point C2 of the second gap surface S2 than between the first vertex V1A of the first gap surface S1 and the first vertex V2A of the second gap surface S2 (or between the second vertex V1B of the first gap surface S1 and the second vertex V2B of the second gap surface S2). Dimensions of the gap G, along with the core material, establish a particular magnetic concentration in each of the first and second gap portions GP1, GP2. The magnetic coupling in the gap G may be impacted by dimensions of the gap in addition to a surface area of the first gap surface S1 and the second gap surface S2, which are related to the cross-sections of the first and second core portions 612, 613. The first gap surface S1 has a first surface area and the second gap surface S2 has a second surface area larger than the first surface area in the illustrated embodiment. In embodiments, dimensions of the gap G may be adjusted based on package thickness of the detector 620 disposed in the gap G. Additionally, in embodiments, dimensions of the gap G may be adjusted such that magnetic fields sensed by magnetic field sensing elements of the detector 620 have a particular angle with respect to the sensing elements, as will be described further below.

The detector 620, which may be provided as a magnetic field sensor, for example, includes at least one first magnetic field sensing element 621 positioned in the first gap portion GP1 and configured to generate a first magnetic field signal in response to a first applied magnetic field $B_A$ (e.g., a magnetic field as may be generated in the first gap portion GP1 in response to a current through the current conductor 630). The detector 620 also includes at least one second magnetic field sensing element 622 positioned in the second gap portion GP2 and configured to generate a second magnetic field signal in response to a second applied magnetic field $B_C$ (e.g., a magnetic field as may be generated in the second gap portion GP2 in response to the current through the current conductor 630). The detector 620 may further include at least one third magnetic field sensing element 623 disposed between the first magnetic field sensing element 621 and the second magnetic field sensing element 622 and configured to generate a third magnetic field signal in response to a third applied magnetic field $B_B$ (e.g., a magnetic field as may be generated in a position between the first magnetic field sensing element 621 and the second magnetic field sensing element 622 in response to the current through the current conductor 630).

The first magnetic field $B_A$ sensed by the at least one first magnetic field sensing element 621 has a first angle with respect to the at least one first magnetic field sensing element 621. Additionally, the second magnetic field $B_C$ sensed by the at least one second magnetic field sensing element 622 has a second angle with respect to the at least one second magnetic field sensing element 622. In embodiments, one or more dimensions of the gap G (and respective gap portions GP1, GP2) may be selected such that the first and second magnetic fields $B_A$, $B_C$ are substantially equal in magnitude and the first and second angles are substantially opposite in polarity, as may reduce the effects of stray magnetic fields, as will be described further below. For example, the first angle (as may be established between magnetic fields $B_A$ and $B_B$) may be on the order of −45° and the second angle (as may be established between magnetic fields $B_B$ and $B_C$) may be on the order of +45°. In embodiments, the above-described first and third gap heights may be selected to be the same as each other such that the first gap portion GP1 is substantially symmetrical to the second gap portion GP2. Additionally, in embodiments the position of the at least one first magnetic field sensing element 621 within the first gap portion GP1 and/or the positon of the at least one second magnetic field sensing element 622 within the second gap portion GP2 may be selected such that the first and second magnetic fields $B_A$, $B_C$ are substantially equal in magnitude and the first and second angles are substantially opposite in polarity. For example, in embodiments in which the first gap portion GP1 is not substantially symmetrical to the second gap portion GP2, the position of the at least one first magnetic field sensing element 621 and/or the positon of the at least one second magnetic field sensing element 622 may be selected to account for the asymmetry and provide for the first and second magnetic fields $B_A$, $B_C$ to be substantially equal in magnitude and the first and second angles to be substantially opposite in polarity.

Figure 8:
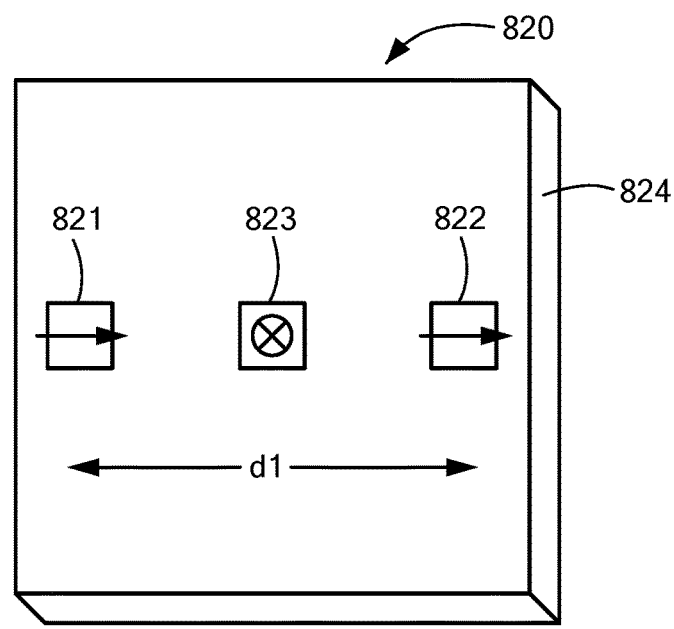
FIG. 8 shows a plan view of a first example detector as may be provided in a current sensor according to the disclosure.
Figure 9:
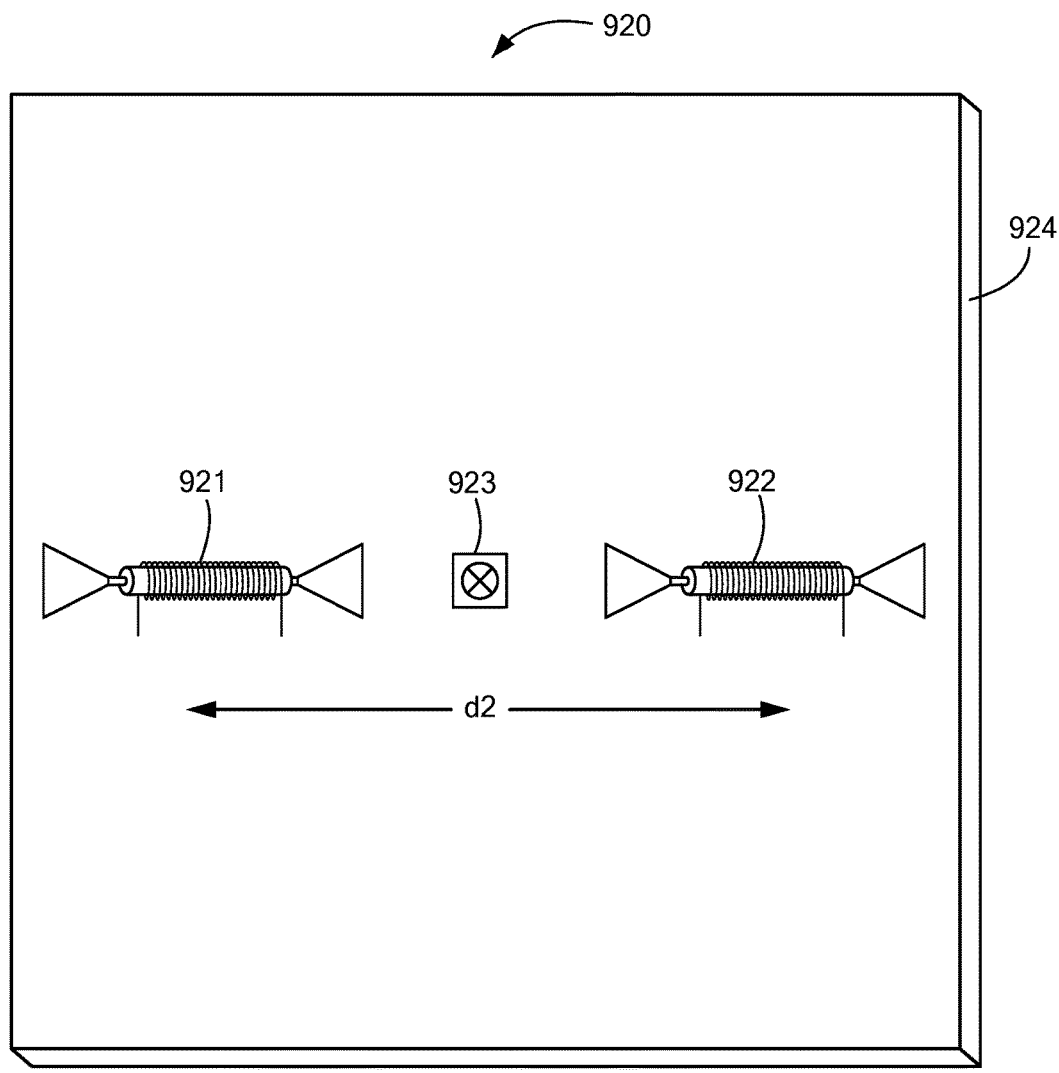
FIG. 9 shows a plan view of a second example detector as may be provided in a current sensor according to the disclosure.

In some embodiments, the at least one first magnetic field sensing element 621 and the at least one second magnetic field sensing element 622 comprise one or more magnetoresistance elements, as shown in FIG. 8 for example, or one or more flux-gate elements, as shown in FIG. 9 for example. The magnetoresistance elements may include one or more of a giant magnetoresistance (GMR) element, a magnetic tunnel junction (MTJ) element and a tunneling magnetoresistance (TMR) element. In some embodiments, the at least one third magnetic field sensing element 623 includes one or more Hall effect elements, as shown in FIGS. 8 and 9 for example.

In operation, circuitry responsive to the first, second and third magnetic field signals can provide one or more output signals of the current sensor 600 indicative of the current through the current conductor 630. For example, a first circuit responsive to the first and second magnetic field signals may generate a first output signal (i.e., a first current sensor output signal) indicative of a measured current through the current conductor 630 in a first current level range and a second circuit responsive to the third magnetic field signal may generate a second output signal indicative of the measured current in a second, different current level range. The magnitude of the first and second output signals may be substantially proportional to a magnitude of the current through the current conductor 630 for the respective current level ranges. In embodiments, the second current level range may include currents having magnitude greater than a magnitude of currents associated with the first current level range. A magnitude of the current level ranges to be sensed may, for example, depend on the current sensing application. For example, in a battery monitoring application in an automobile, a first current level range may correspond to a range suitable for measuring substantially "small" currents (e.g., leakage currents) when the automobile is off and a second current level range may correspond to a range suitable for measuring substantially "large" currents when the automobile is operating.

The current sensor 600 is capable of generating one or more current sensor output signals that are substantially immune to stray magnetic fields. In particular, with the above-described arrangement, stray magnetic fields will have a substantially equal and opposite effect on the at least one first and second magnetic field elements 621, 622, respectively. Stated differently, the at least one first magnetic field sensing element 661 is responsive to the current-generated magnetic field plus the stray field and the at least one second magnetic field sensing element 662 is responsive to the current generated magnetic field minus the stray field. Thus, for example, the first magnetic field signal increases by an amount in response to a stray magnetic field and the second magnetic field signal decreases by the same amount in response to the stray magnetic field. The resulting first and second magnetic field signals may be combined to generate an output signal that is substantially unaffected by the stray magnetic field while being proportional to the magnetic field generated by the current.

Figure 7:
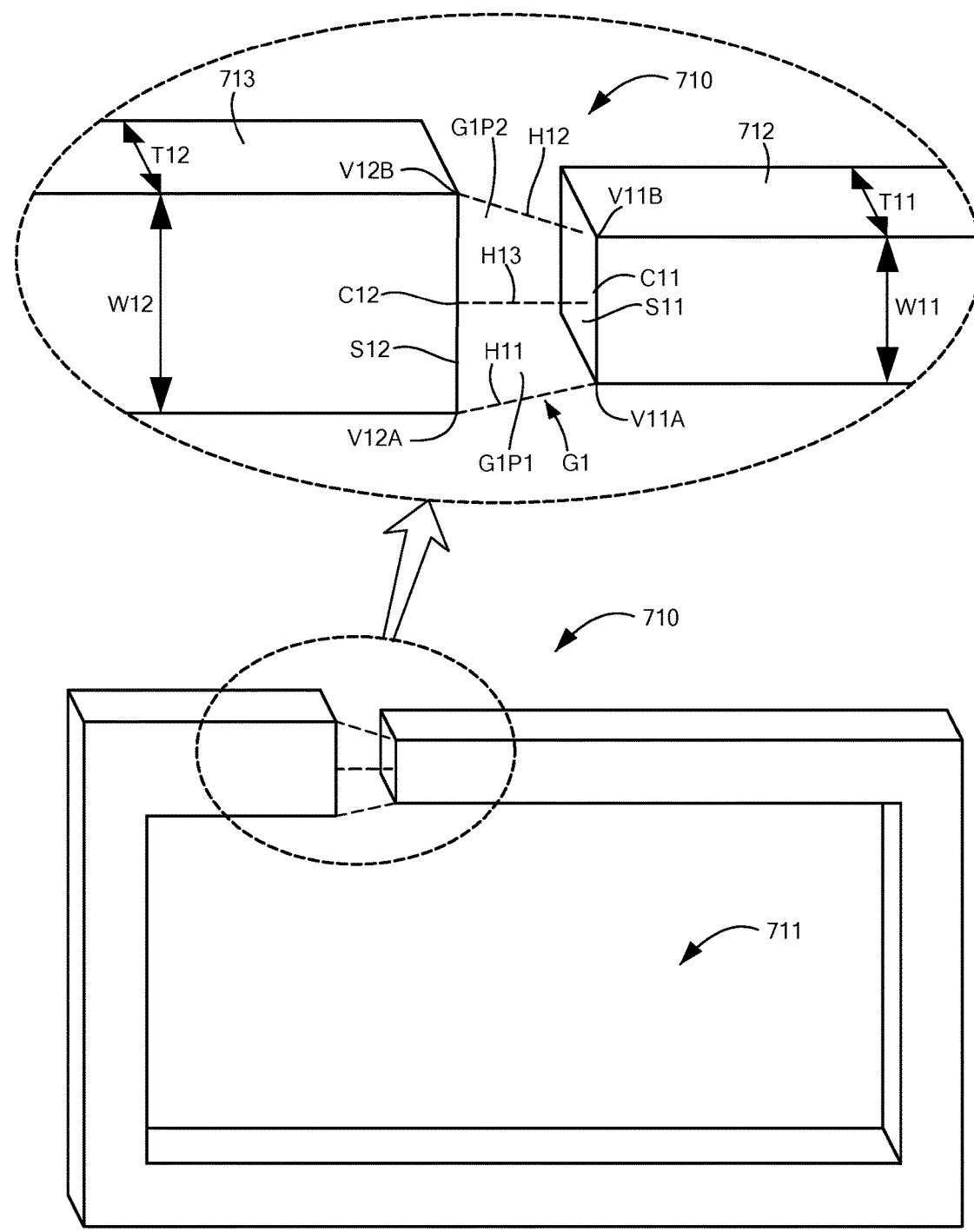
FIG. 7 shows a first example ferromagnetic core as may be provided in a current sensor according to the disclosure.
Figure 7A:
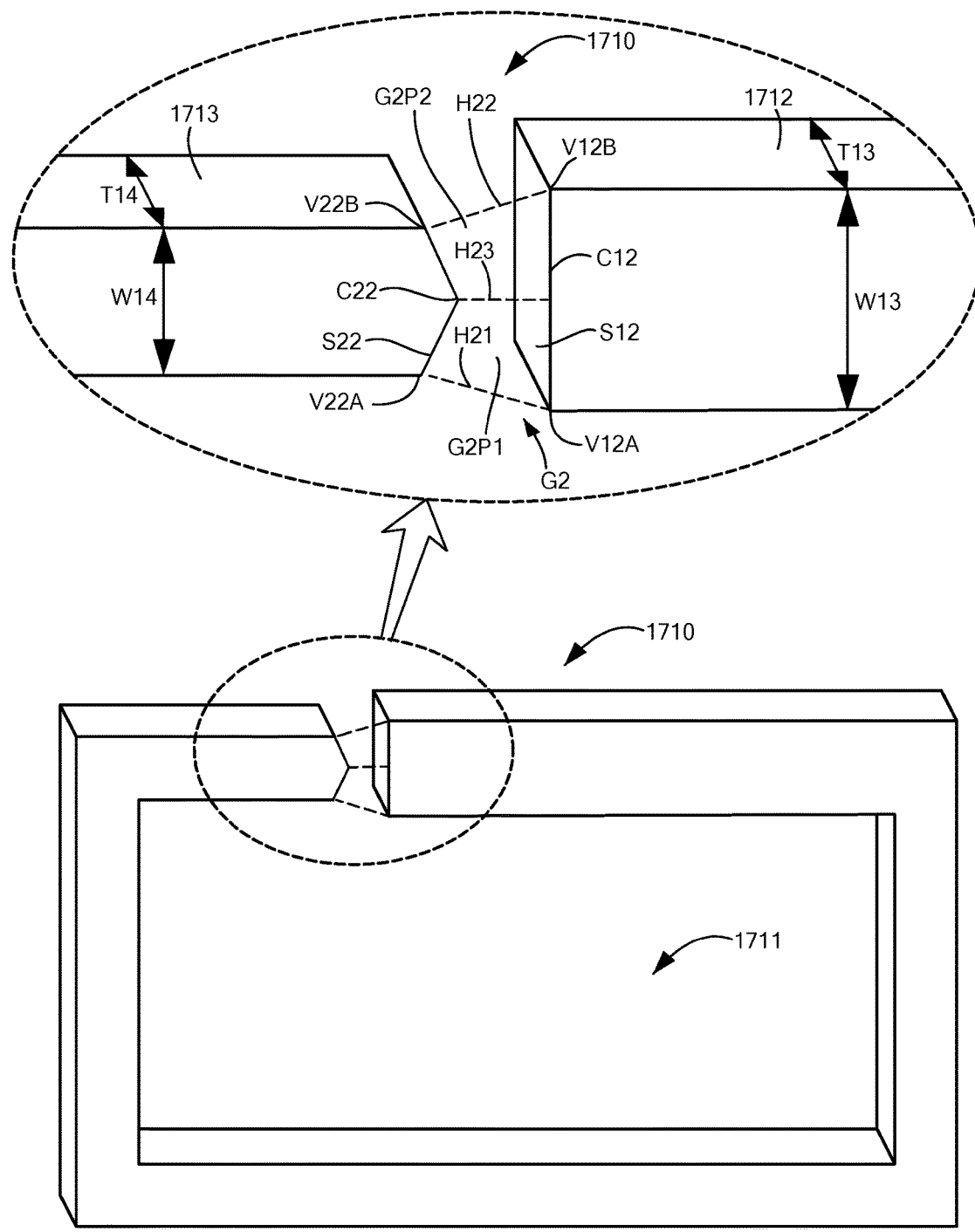
FIG. 7A shows a second example ferromagnetic core as may be provided in a current sensor according to the disclosure.
Figure 7B:
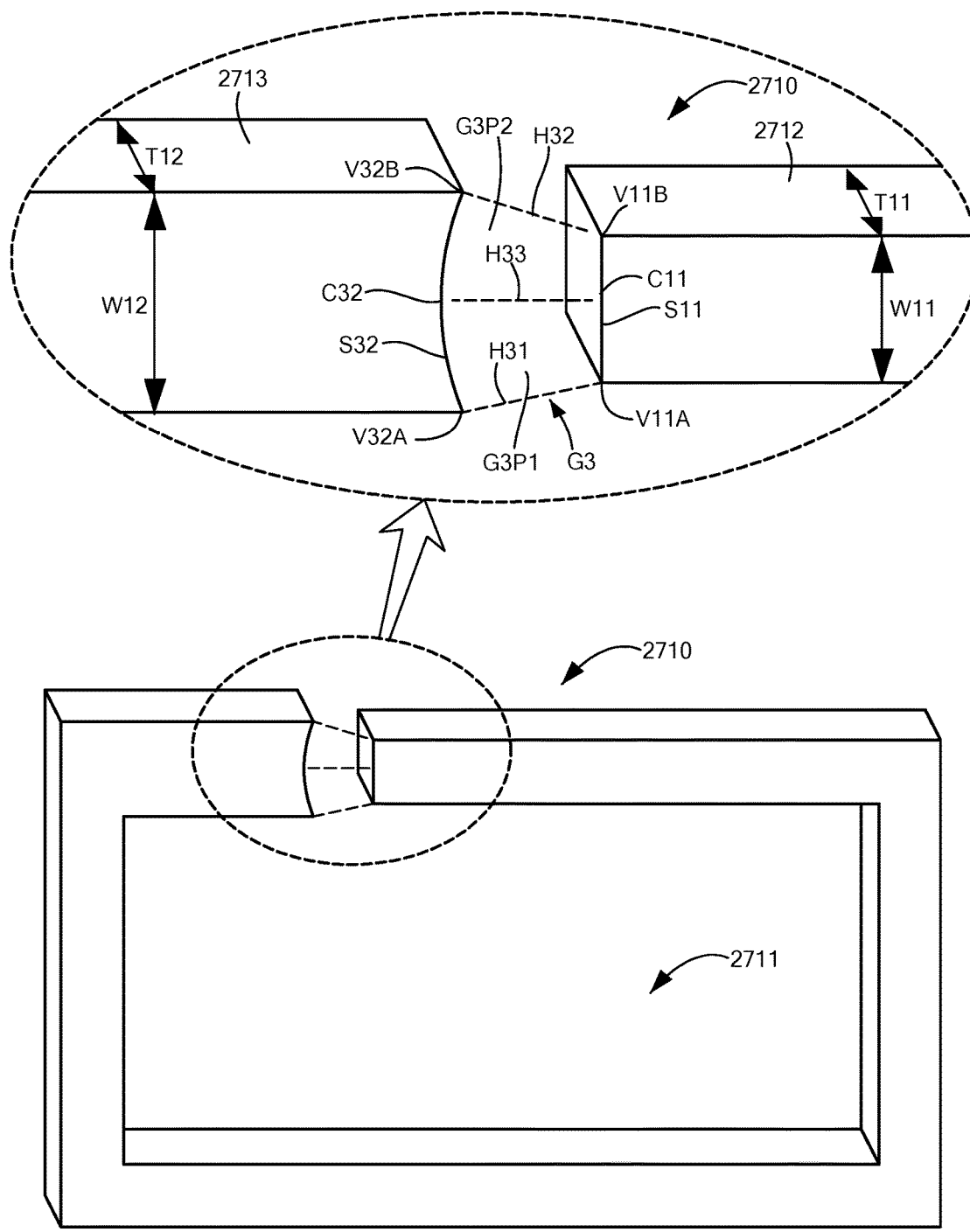
FIG. 7B shows a third example ferromagnetic core as may be provided in a current sensor according to the disclosure.

Referring to FIGS. 7-7B, further example ferromagnetic cores as may replace the core 610 in the current sensor 600 of FIG. 6 are shown. Thus, each of the illustrated alternative cores has a substantially central opening through which a current conductor can be disposed and a gap configured to receive at least a portion of a detector that may be the same as or similar to detector 620.

Referring to FIG. 7, a ferromagnetic core 710 has a substantially central opening 711 for receiving a current conductor (e.g., 630, shown in FIG. 6) and a gap G1 in which a detector (e.g., 620, shown in FIG. 6) may be disposed for sensing a current through the current conductor. The gap G1 comprises a first gap portion G1P1 and a second gap portion G1P2 and has a first gap surface S11 (here, a substantially flat surface) and a second, opposing gap surface S12 (here, also a substantially flat surface) between which the first and second gap portions G1P1, G1P2 are formed. In some embodiments, the detector may be attached to the first gap surface S11.

First gap portion G1P1 can be defined between a first gap height H11 (between a first vertex V11A of the first gap surface S11 and a first vertex V12A of the second gap surface S12) and a second gap height H13 (between a center point C11 of the first gap surface S11 and a center point C12 of the second gap surface S12). Additionally, second gap portion G1P2 can be defined between the second gap height H13 and a third gap height H12 (between a second vertex V11B of the first gap surface S11 and a second vertex V12B of the second gap surface S12). The first gap height H11 is substantially the same as the third gap height H12 in the illustrated embodiment (i.e., the first gap portion G1P1 is substantially symmetrical to the second gap portion G1P2). Thus, the first and second gap portions G1P1, G1P2 have a same or similar gap spacing and may provide substantially same magnetic concentration.

In the illustrated embodiment, the second gap height H13 is smaller than the first and third gap heights H11, H12. Thus, the gap G1 may provide greater magnetic field concentration gain in areas near the center point C11 of the first gap surface S11 and the center point C12 of the second gap surface S12 than in areas near the vertices V11A, V12A, V11B, V12B. Thus, it follows that areas near the center point C11 of the first gap surface S11 and the center point C12 of the second gap surface S12 may be more suitable for sensing smaller currents than other areas of the gap G1.

Dimensions of the first and second gap portions G1P1, G1P2 may be selected such that magnetic fields sensed by first and second magnetic field sensing elements (e.g., 621, 622, shown in FIG. 6) of a detector (e.g., 620, shown in FIG. 6) have a substantially same magnitude and angles of the magnetic fields with respect to the sensing elements have substantially opposite polarities. As discussed above, such arrangement may reduce or cancel the effects of stray magnetic fields. Dimensions of the first and second gap portions G1P1, G1P2 may also be based on the current levels and/or ranges of currents to be sensed and, thus, the level(s) of magnetic field concentration desired in the first and second gap portions G1P1, G1P2.

In the illustrated embodiment, ferromagnetic core 710 has a first portion 712 with a first associated width W11 (defined by the difference between an inner length or diameter of the core 710 proximate to the first core portion 712 and an outer length or diameter of the core 710 proximate to the first core portion 712) and thickness T11. The ferromagnetic core 710 also has a second portion 713 with a second associated width W12 (defined by the difference between an inner length or diameter of the core 710 proximate to second core portion 713 and an outer length or diameter of the core 710 proximate to the second core portion 713) and thickness T12. A first surface area of the first gap surface S11 may be based on a cross-section (W11*T11) of the first core portion 712 and a second surface area of the second gap surface S12 may be based on a cross-section (W12*T12) of the second core portion 713. In the illustrated embodiment, the second gap surface area is larger than the first gap surface area. The first and second gap surface areas may impact placement of magnetic field sensing elements (e.g., 621, 622, shown in FIG. 6) of a detector relative to the gap G1 and/or angles of the magnetic fields sensed by the sensing elements. For example, a spacing between at least one first magnetic field sensing element placed in the first gap portion G1P1 and at least one second magnetic field sensing element placed in the second gap portion G1P2 and/or angles of the first and second magnetic fields sensed by the sensing elements may be based on dimensions of the first and second surface areas. As one example, the sensing elements may be spaced apart by a first predetermined distance in embodiments in which the second gap surface area of the second gap surface S12 has a first value and by a second, larger predetermined distance in embodiments in which the surface area of the second gap surface S12 has a second, larger value.

Referring to FIG. 7A, another example ferromagnetic core 1710 has a substantially central opening 1711 for receiving a current conductor and a gap G2 in which a detector may be disposed for sensing a current through the current conductor. The gap G2 comprises a first gap portion G2P1 and a second gap portion G2P2 and has a first gap surface S12 (here, a substantially flat surface to which the detector may be attached) and a second, opposing gap surface S22 (here, an angled surface having a substantially inverted V shape) between which the first and second gap portions G2P1, G2P2 are formed. The first gap surface S12 is provided in a first portion 1712 of the ferromagnetic core 1710 having a first associated width W13 and thickness T13 and the second gap surface S22 is provided in a second portion 1713 of the ferromagnetic core 1710 having a second associated width W14 and thickness T14. As contrasted to the cores 600, 710 of FIGS. 6 and 7, here, the cross-sectional area of core portion 1713 (i.e., W14*T14) is smaller than the cross-sectional area of core portion 1712 (i.e., W13*T13).

First gap portion G2P1 can be defined between a first gap height H21 (between a first vertex V12A of the first gap surface S12 and a first vertex V22A of the second gap surface S22) and a second gap height H23 (between a center point C12 of the first gap surface S12 and a center point C22 of the second gap surface S22). Additionally, second gap portion G2P2 can be defined between the second gap height H23 and a third gap height H22 (between a second vertex V12B of the first gap surface S12 and a second vertex V22B of the second gap surface S22).

The first gap height H21 is substantially the same as the third gap height H22 and the second gap height H23 is smaller than the first and third gap heights H21, H22 in the illustrated embodiment. Thus, the gap G2 may provide for greater magnetic field concentration in areas near the center point C12 of the first gap surface S12 and the center point C22 of the second gap surface S22 than in other areas near the vertices V12A, V22A, V128, V22B. It follows that areas near the center point C12 of the first gap surface S12 and the center point C22 of the second gap surface S22 may be more suitable for sensing smaller currents than other areas of the gap G2.

One or more dimensions of gap G2 may be selected such that in embodiments in which at least one first magnetic field sensing element (e.g., 621, shown in FIG. 6) is positioned in the first gap portion G2P1 and at least one second magnetic field sensing element (e.g., 622, shown in FIG. 6) is positioned in the second gap portion G2P2, the at least one first sensing element is able to sense a first magnetic field having a first angle with respect to the at least one first sensing element and the at least one second sensing element is able to sense a second magnetic field having a second angle with respect to the at least one second sensing element, with the first and second magnetic fields substantially equal in magnitude and the first and second angles substantially opposite in polarity to provide for stray magnetic field reduction or cancelation.

Referring to FIG. 7B, another example ferromagnetic core 2710 has a substantially central opening 2711 for receiving a current conductor and a gap G3 in which a detector (that may be the same as or similar to detector 620 of FIG. 6) may be disposed for sensing a current through the current conductor. The gap G3 comprises a first gap portion G3P1 and a second gap portion G3P2 and has a first gap surface S11 (here, a substantially flat surface) and a second, opposing gap surface S32 (here, a curved surface having a substantially U shape) between which the first and second gap portions G3P1, G3P2 are formed. The first gap surface S11 is provided in a first portion 2712 of the ferromagnetic core 2710 having a first associated width W11 and thickness T11 and the second gap surface S32 is provided in a second portion 2713 of the ferromagnetic core 2710 having a second associated width W12 and thickness T12.

First gap portion G3P1 can be defined between a first gap height H31 (between a first vertex V11A of the first gap surface S11 and a first vertex V32A of the second gap surface S32) and a second gap height H33 (between a center point C11 of the first gap surface S11 and a center point C32 of the second gap surface S32). Additionally, second gap portion G3P2 can be defined between the second gap height H33 and a third gap height H32 (between a second vertex V11B of the first gap surface S11 and a second vertex V32B of the second gap surface S32).

The first gap height H31 is substantially the same as the third gap height H32 and the second gap height H33 is larger than the first and third gap heights H31, H32 in the illustrated embodiment. Thus, the gap G3 may provide for less magnetic field concentration gain in areas near the center point C11 of the first gap surface S11 and the center point C32 of the second gap surface S32 than in areas near the vertices V11A V32A, V11B, V32B. It follows that areas near the center point C11 of the first gap surface S11 and the center point C32 of the second gap surface S32 may be more suitable for sensing larger currents than other areas of the gap G3.

Here again, one or more dimensions of gap G3 may be selected such that in embodiments in which at least one first magnetic field sensing element (e.g., 621, shown in FIG. 6) is positioned in the first gap portion G3P1 and at least one second magnetic field sensing element (e.g., 622, shown in FIG. 6) is positioned in the second gap portion G3P2, the at least one first sensing element is able to sense a first magnetic field having a first angle with respect to the at least one first sensing element and the at least one second sensing element is able to sense a second magnetic field having a second angle with respect to the at least one second sensing element, with the first and second magnetic fields substantially equal in magnitude and the first and second angles substantially opposite in polarity to provide for stray magnetic field reduction or cancelation.

A curvature of second gap surface S32 may also impact placement of the sensing elements and/or angles of the magnetic fields sensed by the sensing elements. For example, a spacing between at least one first magnetic field sensing element placed in the first gap portion G3P1 and at least one second magnetic field sensing element placed in the second gap portion G3P2 and/or angles of the first and second magnetic fields sensed by the sensing elements may be based on a level of curvature of second gap surface S32. As one example, the sensing elements may be spaced apart by a first predetermined distance in embodiments in which the second gap surface S32 has a first level of curvature and by a second, smaller predetermined distance in embodiments in which the second gap surface S32 has a second, larger level of curvature. The level of curvature may, for example, be increased or decreased by adjusting the first and third gap heights H31, H32 for example.

It should be appreciated that the example ferromagnetic cores of FIGS. 6-7B are but several of many potential configurations of cores in accordance with the disclosure. For example, while ferromagnetic cores including a gap surface with a substantially V shape or a substantially U shape are shown in FIGS. 6-7B, it should be appreciated that the first and/or second gap surfaces may take the form of a variety of different shapes.

Additionally, while ferromagnetic cores including two gap portions are shown, it should be appreciated that ferromagnetic cores according to the disclosure may include more than two gap portions in some embodiments. For example, a ferromagnetic core may include four gap portions.

Referring to FIG. 8, an example detector 820, which may be the same as or similar to detector 620 of FIG. 6, for example, includes a first magnetic field sensing element 821, a second magnetic field sensing element 822, and a third magnetic field sensing element 823. The third sensing element 823 is disposed between the first sensing element 821 and the second sensing element 822 on a substrate, such as a semiconductor die 824.

The first and second sensing elements 821, 822 are selected to sense "in-plane" magnetic field components (i.e., magnetic fields in the plane of the respective sensing element 821, 822, or silicon of the sensing elements). For example, the first sensing element 821 may take the form of a magnetoresistance element, for example, and may be positioned in a first gap portion (e.g., G1P1, shown in FIG. 7) of a ferromagnetic core (e.g., 710, shown in FIG. 7). Additionally, the second sensing element 822 may take the same form as the first sensing element 821 and may be positioned in a second gap portion (e.g., G1P2, shown in FIG. 7) of the ferromagnetic core. It will be appreciated however, that any sensing technologies capable of sensing such "in-plane" magnetic field components can be used to provide the first and second sensing elements. Further, the third sensing element 823 is selected to sense "out-of-plane" magnetic field components (i.e., magnetic fields substantially perpendicular to the plane of the third sensing element 823, or silicon of the third sensing element). In the illustrated embodiment, the third sensing element 823 may take the form of a Hall effect element, for example, and may be positioned in an area of the ferromagnetic core gap between which the first and second sensing elements 821, 822 are disposed. For example, the third sensing element 823 may be positioned at a center point of a gap surface (e.g., C11 of gap surface S11, shown in FIG. 7) to which the detector 820 is attached and the first and second sensing elements 821, 822 may be spaced substantially equidistantly from the third sensing element 823. It will be appreciated that any sensing technologies capable of sensing such "out-of-plane" magnetic field components can be used to provide the third sensing element.

Figure 8A:
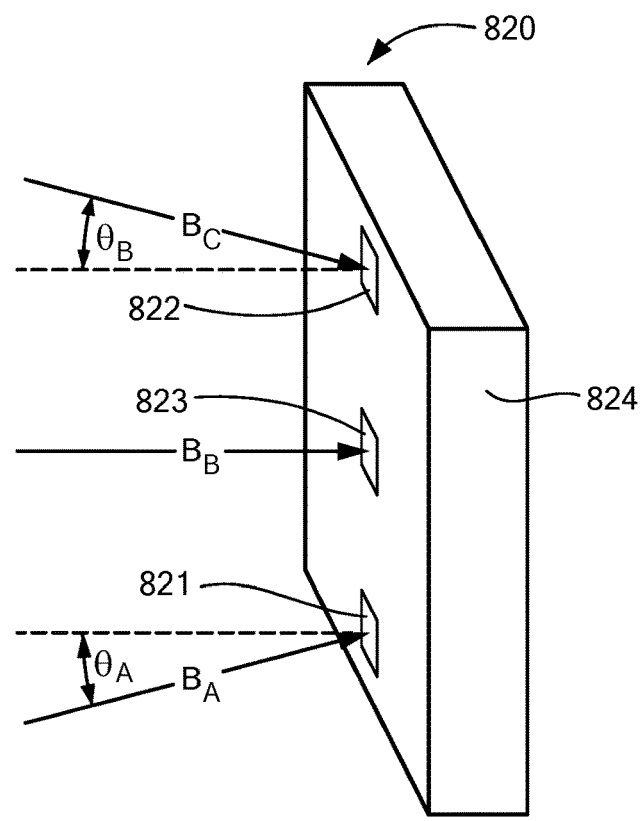
FIG. 8A is a perspective view of the detector of FIG. 8.

Referring also to the angled view of the detector 820 in FIG. 8A, the first sensing element 821 may be configured to generate a first magnetic field signal in response to a first magnetic field $B_A$ generated in the first gap portion. The first magnetic field $B_A$ has a first angle $\theta_A$ (e.g., −30°) with respect to a reference axis orthogonal to a plane the first sensing element 821. Additionally, the second sensing element 822 may be configured to generate a second magnetic field signal in response to a second magnetic field $B_C$ generated in the second gap portion. The second magnetic field $B_C$ has a second angle $\theta_B$ (e.g., about +30°) with respect to a reference axis orthogonal to a plane of the second sensing element 822. The first and second magnetic field sensing elements 821, 822 may be configured to sense "in-plane" magnetic field components (i.e., magnetic fields in the plane of the respective sensing element 821, 822).

The first and second magnetic fields $B_A$, $B_C$ are substantially equal in magnitude and the first and second angles $\theta_A$, $\theta_B$ are substantially opposite in polarity. In embodiments, the foregoing is a result of the first and second gap portions in which the sensing elements 821, 822 are disposed. For example, as discussed above, gaps portions of ferromagnetic cores in which the detector 820 is disposed are formed between first and second, opposing gaps surfaces and have an associated gap spacing. One or more dimensions of the gap surfaces and/or the gap spacings may be selected to provide the first and second magnetic fields (e.g., $B_A$, $B_C$) substantially equal in magnitude and having angles (e.g., $\theta_A$, $\theta_B$) relative to the respective magnetic field sensing elements (e.g., 821, 822) that are opposite in polarity. The distance or spacing d1 between the first and second sensing elements 821, 822 may impact the respective incident magnetic field magnitudes and angles. In some embodiments, the sensing elements 821, 822 are spaced apart by predetermined distance d1 on the order of between approximately 1 mm to 2 mm.

The first and second magnetic field signals generated by sensing elements 821, 822 may be received by circuitry configured to generate an output signal indicative of the current through the current conductor (e.g., when the current is within a first current level range). The circuitry may combine (e.g., sum or subtract) the first and second magnetic field signals in generating the output signal, thereby providing an output signal that is substantially unaffected by stray magnetic fields which may be present in the first and second magnetic fields $B_A$, $B_C$ sensed by the first and second sensing elements 821, 822 since the stray magnetic fields will have an equal and opposite affect on the magnetic fields $B_A$, $B_C$.

The third sensing element 823 may be configured to generate a third magnetic field signal in response to a third magnetic field $B_B$ incident on the third sensing element. The third magnetic field $B_B$ may be sensed by the third sensing element 823 substantially perpendicular to a plane of the third sensing element 823 in some embodiments and the third magnetic field signal may be received by circuitry configured to provide an output signal indicative of the current through the current conductor (e.g., when the current is within a second, higher current level range). It will be appreciated that while the third element 823 is shown positioned between the first and second elements 821, 822, other relative placements are possible.

With the above-described arrangement, the detector 820 is configured to sense the current through the current conductor within at least two current level ranges and generate an output signal for at least one of the current level ranges that is substantially unaffected by stray magnetic fields.

Figure 10:
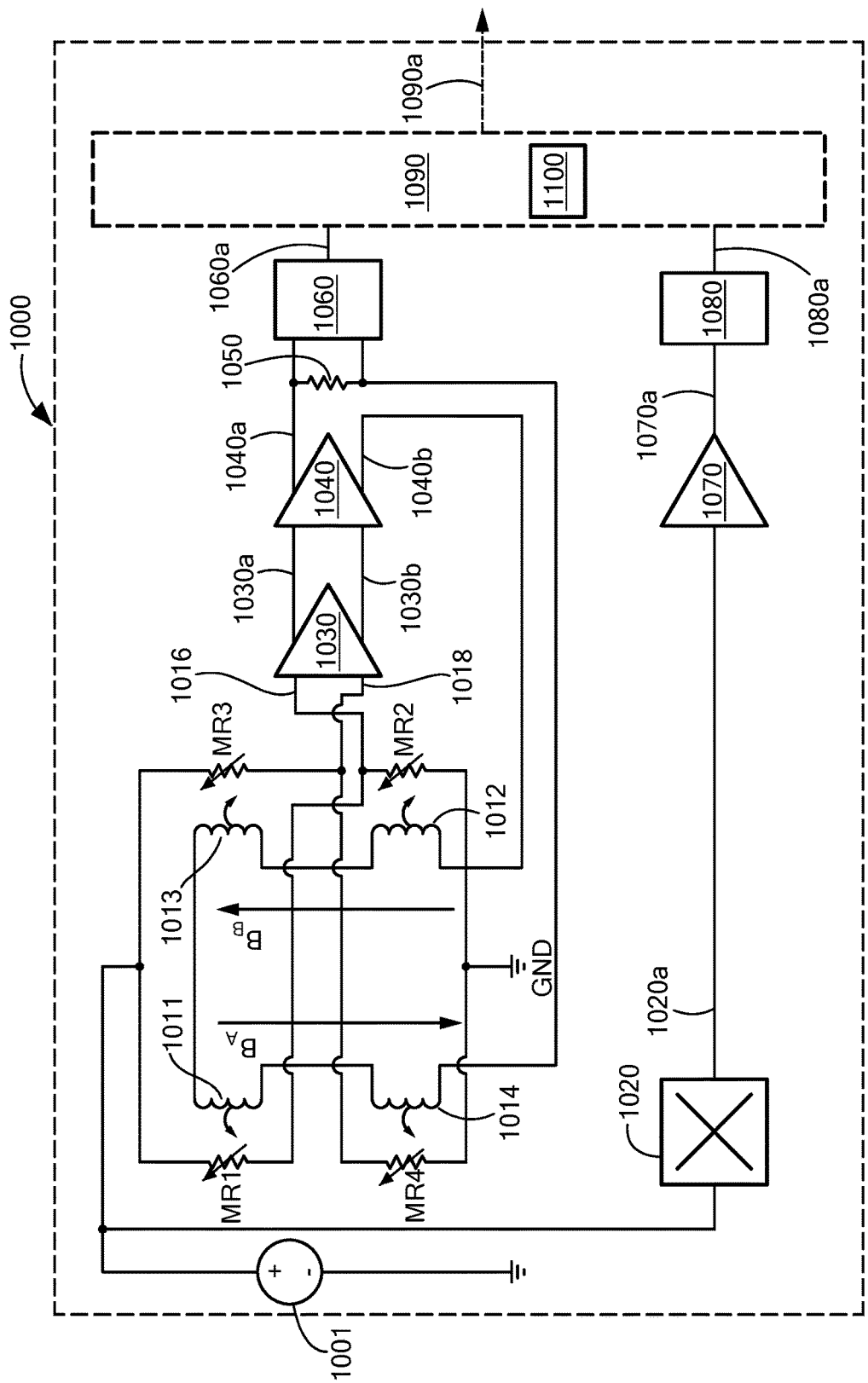
FIG. 10 shows a circuit diagram of the detector of FIG. 8.

It will be appreciated that one or more of the sensing elements 821, 822, 823 may include a plurality of individual elements in some embodiments. For example, the first and second sensing elements 821, 822 each may comprise a plurality of sensing elements (e.g., MR elements) coupled in a bridge configuration, as shown in FIG. 10 for example.

Additionally, while the first, second and third sensing elements 821, 822, 823 are shown as supported by a single substrate 824 in the illustrated embodiment, it is understood that the sensing elements 821, 822, 823 may be supported by two or more substrates in some embodiments. For example, the first sensing element 821 and the second sensing element 822 may be supported by a first die and the third sensing element 823 may be supported by a second die. The second die may be attached to the first die, for example, in an area between the first sensing element 821 and the second sensing element 822. In some embodiments, the sensing elements and supporting substrates may be provided in the same or in separate integrated circuit packages.

Referring to FIG. 9, another example detector 920 includes a first magnetic field sensing element 921, a second magnetic field sensing element 922, and third magnetic field sensing element 923 supported by a substrate such as a semiconductor die 924. The third sensing element 923 may be positioned between the first sensing element 921 and the second sensing element 922 and the first and second sensing elements 921, 922 are spaced apart by a predetermined distance d2. Here, the first and second sensing elements 921, 922 are shown in the form of flux-gate elements.

First and second sensing elements 921, 922 may be disposed in first and second gap portions (e.g., GP1, GP2, shown in FIG. 7) and configured to generate first and second respective magnetic field signals in response to first and second magnetic fields generated in the gap portions. The first and second magnetic fields may be substantially equal in magnitude and first and second angles of the first and second magnetic fields with respect to a plane of the detector 920 may be substantially opposite in polarity.

The first magnetic field signal from flux-gate 921, which may appear as an amplitude variation on the first sensing element's output, may be received by circuitry configured to process the first magnetic field signal (e.g., demodulate and filter the signal) and generate a first sensed signal indicative of the first magnetic field. Additionally, the second magnetic field signal from flux-gate 922 may be received by circuitry configured to process the second magnetic field signal and generate a second sensed signal indicative of the second magnetic field. The first and second sensed signals may be received by circuitry configured to generate an output signal indicative of the current through the current conductor (e.g., when the current is within a first current level range). The circuitry may combine (e.g., sum or subtract) the first and second sensed signals in generating the output signal, thereby providing an output signal that is substantially unaffected by stray magnetic fields which may be present in the first and second magnetic fields sensed by the first and second sensing elements 921, 922.

The third sensing element 923 may be configured to generate a third magnetic field signal in response to a third magnetic field incident on the third sensing element 923 (e.g., in response to the current through the current conductor). The third magnetic field signal may be received by circuitry configured to provide an output signal indicative of the current through the current conductor (e.g., when the current is within a second, higher current level range).

It should be appreciated that the detectors 820, 920 of FIGS. 8 and 9 are but two of many potential configurations of detectors in accordance with the concepts, systems, circuits and techniques described herein. As one example, while third sensing element 823, 923 may take the form of a Hall effect element in the illustrated embodiments, in some embodiments the third sensing element make take the form of another type of sensing element, for example, a magnetoresistance element. The third sensing element may be used as a so-called reference sensing element in some embodiments and the detectors may be calibrated based upon a particular placement of the third sensing element with respect to at least one of the first and second sensing elements of the detectors (e.g., to reduce or substantially eliminate any output errors which may occur due to the placement). In such embodiments, the detectors may generate an output signal indicative of a current through a current conductor for a single current level range.

Referring to FIG. 10, a circuit diagram of an example detector 1000 of a current sensor according to the disclosure is shown. The detector 1000, which may be the same as or similar to detector 620, 820, 920 for example, includes at least one first magnetic field sensing element (here, magnetoresistance elements MR1, MR4), at least one second magnetic field sensing element (here, magnetoresistance elements MR2, MR3) and at least one third magnetic field sensing element 1020 coupled to a voltage source 1001. The detector 1000 also includes circuitry coupled to respective sensing elements and configured to generate a current sensor output signal 1090a indicative of a level of current through a current conductor (e.g., 630, shown in FIG. 6) for which the detector 1000 is configured to sense a current.

The first sensing elements (i.e., magnetoresistance elements MR1, MR4) may be positioned in a first gap portion (e.g., GP1, shown in FIG. 6) of a ferromagnetic core and thus, may experience an incident magnetic field $B_A$ and the second sensing elements (i.e., magnetoresistance elements MR2, MR3) may be positioned in a second gap portion (e.g., GP2, shown in FIG. 6) of the ferromagnetic core and thus, may experience an incident magnetic field $B_B$. Additionally, the third sensing element 1020 may be positioned in an area of the ferromagnetic core gap between which the sensing elements MR1, MR4 and MR2, MR3. The magnetic field $B_A$ incident on elements MR1 and MR2 (i.e., $B_A$) is equal in magnitude but has an angle with respect to a plane of the detector 100 that is opposite in polarity with respect to the magnetic field $B_B$ incident on elements MR3, MR4.

The first sensing elements MR1, MR4 and the second sensing elements MR2, MR3 are coupled in a bridge configuration (e.g., a Wheatstone bridge configuration) in the illustrated embodiment. A first node 1016 between magnetoresistance elements MR1, MR2 is coupled to a first input of an amplifier 1030 and a second node 1016 between magnetoresistance elements MR3, MR4 is coupled to a second input of amplifier 1030. As the measured current increases, the resulting magnetic fields $B_A$, $B_B$ increase. Because of the opposite polarity angles $\theta_A$, $\theta_B$ of the fields $B_A$, $B_B$, elements MR1, MR4 see a field $B_A$ in an opposite direction with respect to the field $B_B$ seen by elements MR2, MR3. As a result, as fields $B_A$, $B_B$ increase, the resistance of elements MR1, MR4 decreases, whereas the resistance of elements MR2, MR3 increases.

In the illustrated closed loop configuration, feedback coils 1011, 1012, 1013, 1014 are configured to generate respective magnetic fields to counteract the applied magnetic fields sensed by the elements MR1, MR2, MR3, MR4 to drive the magnetic fields incident on the elements to about zero Gauss when no stray fields are present (or, in the presence of stray fields, to drive the fields sensed by the elements MR1, MR2, MR3, MR4 to approximately equal values). Due to the placement of the sensing elements MR1, MR2, MR3, MR4 in the illustrated embodiment, the magnetic fields generated by feedback coils 1011, 1014 have a first direction and the magnetic fields generated by feedback coils 1012, 1013 have a second, opposite direction in order to thereby counteract the opposite direction of fields $B_A$, $B_B$.

Amplifier 1030 generates a first differential signal 1030a, 1030b. A second amplifier 1040 is coupled to receive the first differential signal 1030a, 1030b and configured to generate a second differential signal 1040a, 1040b. Feedback coils 1012, 1013 are driven by an output 1040b of second amplifier 1040 and feedback coils 1011, 1014 are driven by an output 1040a of amplifier 1040 through a sense resistor 1050. It should be appreciated that although detector 1000 is shown to be a closed loop detector, detector 1000 may be an open loop detector in some embodiments.

A circuit 1060 is coupled to detect a current through sense resistor 1050, which current is indicative of a measured current through the current conductor in a first current level range. Circuit 1060 may include various signal processing components such as amplification, gain and/or offset control and/or analog-to-digital conversion components. An output signal 1060a may provide a first detector output signal.

The third sensing element 1020 may be configured to generate a third magnetic field signal 1020a in response to a third magnetic field (e.g., $B_C$ in FIG. 6) incident on the third sensing element 1020 (e.g., in response to the current through the current conductor). Amplifier 1070 and circuit 1080 (which, like circuit 1060 may contain amplification, gain and/or offset control and/or analog-to-digital functionality) may be responsive to the third magnetic field signal 1020a to generate a second detector output signal 1080a indicative of the measured current through the current conductor in a second current level range. While third sensing element 1020 is shown as comprising a single element in the illustrated embodiment, it is understood that third sensing element 1020 may include a plurality of sensing elements in some embodiments.

In some embodiments, detector output signals 1060a, 1080a may be received by an output circuit 1090 configured to generate a current sensor output signal 1090a indicative of the current through the current conductor. Alternatively, output circuit 1090 may be omitted and the detector output signals 1060a, 1080a may be coupled to external circuits and/or systems for further processing, as may include combining such signals.

In embodiments containing output circuit 1090, the first and second detector output signals 1060a, 1080a may be processed in various ways to provide sensor output signal 1090a. For example, output circuit 1090 may combine signals 1060a, 1080a in such a way that the current sensor output signal 1090a is indicative of the first detector output signal 1060a when the current through the current conductor is within the first current level range and of the second detector output signal 1080a when the current through the current conductor is within the second current level range. To this end, the circuit 1090 may be configured to determine when to provide the output signal 1090a in the form of the first detector output signal 1060a and when to provide the output signal 1090a in the form of the second detector output signal 1080a based on a saturation point of the sensing elements. For example, the detector output signal 1090a may be provided by signal 1060a when the current through the conductor is less than a level that would saturate MR elements 1011, 1012, 1013, 1014 and may be provided by signal 1080a when the current through the conductor exceeds the level that would saturate MR elements 1011, 1012, 1013, 1014.

In another example embodiment in which output circuit 1090 combines first and second detector output signals 1060a, 1080a to provide sensor output signal 1090a, the output signal 1090a may be provided in the form of a serial digital signal format indicative of both the first detector output signal 1060a and the second detector output signal 1080a. The output signal 1090a may additionally be indicative of other system parameters, such as a temperature of the current sensor in which the detector is provided, an error flag (or flags) generated in response to detection of an error, etc. Various formats are suitable for the digital current sensor output signal 1090a including but not limited to SENT, SPI, I²C, etc.

In some embodiments, the output signal 1090a is generated in response to stored values in a memory device 1100 (e.g., EEPROM) of the output circuit 1090. The output circuit 1090 may apply gain and/or offset correction to the stored first and/or second detector output signals 1060a, 1080a. Temperature values, error flags, etc. may also be stored in and retrieved from registers of the memory device 1100 and used to generate the output signal 1090a.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in particular applications (e.g., hybrid electric vehicle inverter, DC-to-DC converter and electric power steering applications) but rather, may be useful in substantially any application where it is desired to sense a current through a current conductor.

Having described preferred embodiments, which serve to illustrate various concepts, structures and techniques, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:
1. A current sensor, comprising:
a ferromagnetic core having a substantially central opening for receiving a current conductor and a gap comprising at least two gaps portions; and
a detector comprising at least one first magnetic field sensing element disposed in a first one of the gap portions and configured to generate a respective first magnetic field signal in response to a first magnetic field having a first angle with respect to the at least one first magnetic field sensing element and at least one second magnetic field sensing element disposed in a second one of the gap portions and configured to generate a respective second magnetic field signal in response to a second magnetic field having a second angle with respect to the at least one second magnetic field sensing element, wherein the first and second magnetic fields are substantially equal in magnitude and wherein the first and second angles are substantially opposite in polarity.
2. The current sensor of claim 1, wherein a first one of the first and second magnetic field signals increases in response to a stray magnetic field and a second one of the first and second magnetic field signals decreases in response to the stray magnetic field, wherein the current sensor further comprises a circuit responsive to the first magnetic field signal and to the second magnetic field signal to generate an output signal that is substantially unaffected by the stray magnetic field.
3. The current sensor of claim 1, further comprising at least one third magnetic field sensing element configured to generate a third magnetic field signal in response to a third magnetic field incident on the at least one third magnetic field sensing element.

4. The current sensor of claim 3, wherein the at least one first magnetic field sensing element is configured to sense the first magnetic field in a plane of the at least one first magnetic field sensing element, the at least one second magnetic field sensing element is configured to sense the second magnetic field in a plane of the at least one second magnetic field sensing element, and the at least one third magnetic field sensing element is configured to sense the third magnetic field substantially perpendicular to a plane of the at least one third magnetic field sensing element.

5. The current sensor of claim 3, wherein the at least one first magnetic field sensing element and the at least one second magnetic field sensing element comprise one or more magnetoresistance elements or one or more flux-gate elements.

6. The current sensor of claim 5, wherein the magnetoresistance elements comprise one or more of a giant magnetoresistance (GMR) element, a magnetic tunnel junction (MTJ) element and a tunneling magnetoresistance (TMR) element.

7. The current sensor of claim 6, wherein the at least one first magnetic field sensing element and the at least one second magnetic field sensing element comprise a plurality of magnetoresistance elements coupled in a bridge configuration.

8. The current sensor of claim 3, wherein the at least one third magnetic field sensing element comprises one or more Hall effect elements.

9. The current sensor of claim 3, wherein the at least one first magnetic field sensing element and the at least one second magnetic field sensing element are configured to sense a first current level range through the current conductor, and wherein the at least one third magnetic field sensing element is configured to sense a second, different current level range through the current conductor.

10. The current sensor of claim 9, wherein the second current level range comprises currents having a magnitude greater than a magnitude of currents associated with the first current level range.

11. The current sensor of claim 9, wherein the detector further comprises a first circuit responsive to the first magnetic field signal and to the second magnetic field signal to generate a first detector output signal indicative of a measured current in the first current level range, and wherein the detector further comprises a second circuit responsive to the third magnetic field signal to generate a second detector output signal indicative of the measured current in the second current level range.

12. The current sensor of claim 11, wherein the detector further comprises an output circuit responsive to the first detector output signal and the second detector output signal to generate one or more output signals of the current sensor indicative of the current through the current conductor.

13. The current sensor of claim 12, wherein the first detector output signal and the second detector output signal are combined to generate the current sensor output signal.

14. The current sensor of claim 3, wherein the at least one third magnetic field sensing element is disposed between the at least one first magnetic field sensing element and the at least one second magnetic field sensing element.

15. The current sensor of claim 3, wherein the at least one first magnetic field sensing element, the at least one second magnetic field sensing element and the at least one third magnetic field sensing element are supported by a single die.

16. The current sensor of claim 1, wherein the gap has a first gap surface with a first surface area and a second, opposing gap surface with a second, larger surface area than the first surface area, and wherein the detector is attached to the first gap surface.

17. The current sensor of claim 16, wherein the first gap surface is a substantially flat surface and the second gap surface is an angled surface or a curved surface.

18. The current sensor of claim 17, wherein the second gap surface has a substantially V shape or a substantially U shape.

19. The current sensor of claim 17, wherein the at least one third magnetic field sensing element is positioned at a center point of the first gap surface and the at least one first magnetic field sensing element and the at least one second magnetic field sensing element are spaced substantially equidistantly from the at least one third magnetic field sensing element.

20. A method of sensing a current through a current conductor disposed through an opening of a ferromagnetic core having a gap, the method comprising:
    placing at least one first magnetic field sensing element in a first portion of the gap, the at least one first magnetic field sensing element generating a first magnetic field signal in response to a first magnetic field having a first angle with respect to the at least one first magnetic field sensing element;
    placing at least one second magnetic field sensing element in a second portion of the gap, the at least one second magnetic field sensing element generating a second magnetic field signal in response to a second magnetic field having a second angle with respect to the at least one second magnetic field sensing element, wherein the first and second magnetic fields are substantially equal in magnitude and wherein the first and second angles are substantially opposite in polarity; and
    generating a first detector output signal in response to the first magnetic field signal and the second magnetic field signal when the current through the current conductor is within a first current level range, wherein the first detector output signal is indicative of a measured current in the first current level range.

21. The method of claim 20, further comprising placing at least one third magnetic field sensing element between the at least one first magnetic field sensing element and the at least one second magnetic field sensing element, the at least one third magnetic field sensing element generating a third magnetic field signal in response to a third magnetic field incident on the at least one third magnetic field sensing element.

22. The method of claim 21, further comprising generating a second detector output signal in response to the third magnetic field signal when the current through the current conductor is within a second, different current level range than the first current level range, wherein the second detector output signal is indicative of a measured current in the second current level range.

23. The method of claim 22, further comprising generating an output signal of the current sensor with an output circuit in response to the first detector output signal and the second detector output signal, wherein the current sensor output signal is indicative of the current through the current conductor.

24. The method of claim 23, wherein generating an output signal of the current sensor comprises combining the first detector output signal and the second detector output signal to generate the current sensor output signal.

25. A current sensor, comprising:
a ferromagnetic core having a substantially central opening for receiving a current conductor and a gap;
means positioned in a first portion of the gap for generating a first magnetic field signal in response to a first magnetic field having a first angle with respect to the first magnetic field signal generating means; and
means positioned in a second portion of the gap for generating a second magnetic field signal in response to a second magnetic field having a second angle with respect to the second magnetic field signal generating means, wherein the first and second magnetic fields are substantially equal in magnitude and wherein the first angle and the second angle are substantially opposite in polarity.

26. The current sensor of claim 25, further comprising means for generating an output signal of the current sensor in response to the first magnetic field signal and the second magnetic field signal, the current sensor output signal indicative of the current through the current conductor.

27. The current sensor of claim 25, wherein the gap has a first gap surface with a first surface area and a second, opposing gap surface with a second, larger surface area than the first surface area, and wherein the first magnetic field signal generating means and the second magnetic field signal generating means are attached to the first gap surface.

\* \* \* \* \*

UNITED STATES PATENT AND TRADEMARK OFFICE
CERTIFICATE OF CORRECTION

PATENT NO. : 10,114,044 B2
APPLICATION NO. : 15/805616
DATED : October 30, 2018
INVENTOR(S) : Dominik Geisler et al.

Page 1 of 1

It is certified that error appears in the above-identified patent and that said Letters Patent is hereby corrected as shown below:

In the Specification

Column 16, Line 49 delete "upon a positon" and replace with --upon a position--.

Column 18, Line 47 delete "a positon 401" and replace with --a position 401--.

Column 26, Line 45 delete "and/or the positon" and replace with --and/or the position--.

Column 26, Line 53 delete "and/or the positon" and replace with --and/or the position--.

Column 32, Line 34 delete "opposite affect" and replace with --opposite effect--.

Signed and Sealed this
Twelfth Day of February, 2019

Andrei Iancu
*Director of the United States Patent and Trademark Office*